(12) United States Patent
Lim et al.

(10) Patent No.: US 12,192,315 B2
(45) Date of Patent: Jan. 7, 2025

(54) MONITORING CIRCUIT OF PHASE LOCKED LOOP AND OPERATING METHOD THEREOF

(71) Applicant: SAMSUNG ELECTRONICS CO., LTD., Suwon-si (KR)

(72) Inventors: Dokyung Lim, Seoul (KR); Sounghun Shin, Anyang-si (KR); Wooseok Kim, Suwon-si (KR); Wonsik Yu, Anyang-si (KR); Chanyoung Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/943,932

(22) Filed: Sep. 13, 2022

(65) Prior Publication Data
US 2023/0082930 A1     Mar. 16, 2023

(30) Foreign Application Priority Data
Sep. 16, 2021 (KR) .................. 10-2021-0124265

(51) Int. Cl.
*H03D 3/24* (2006.01)
*H04L 7/033* (2006.01)
*H04L 43/087* (2022.01)

(52) U.S. Cl.
CPC ............ *H04L 7/033* (2013.01); *H04L 43/087* (2013.01)

(58) Field of Classification Search
CPC ....... H04L 7/033; H04L 43/087; G06F 30/00; G06F 1/08; H03L 7/18; H03L 7/187; H03L 7/1976; H03L 7/183

USPC .................. 375/373–376, 327, 224, 226
See application file for complete search history.

(56) References Cited

U.S. PATENT DOCUMENTS

| | | | | |
|---|---|---|---|---|
| 5,977,836 A | * | 11/1999 | Swan | ................. H03L 7/18 331/14 |
| 6,081,164 A | * | 6/2000 | Shigemori | ............ H03L 7/183 331/25 |
| 6,696,828 B2 | | 2/2004 | Yoshizawa | |
| 7,627,835 B2 | * | 12/2009 | Feng | ................. G06F 30/00 716/133 |
| 10,386,885 B2 | | 8/2019 | Kaneko | |
| 10,958,278 B2 | * | 3/2021 | Gur | ................. H03L 7/187 |

(Continued)

FOREIGN PATENT DOCUMENTS

| | | |
|---|---|---|
| EP | 0889411 B1 | 6/2003 |
| JP | 2006-180349 A | 7/2006 |

(Continued)

OTHER PUBLICATIONS

Communication dated Feb. 9, 2023 by the European Patent Office in European Patent Application No. 22193861.6.

*Primary Examiner* — Phuong Phu
(74) *Attorney, Agent, or Firm* — Sughrue Mion, PLLC

(57) ABSTRACT

A monitoring circuit for a high frequency signal includes: a phase locked loop configured to generate a divided output signal with respect to an input signal based on a plurality of dividers; a plurality of dividing monitoring circuits configured to receive dividing input signals and dividing output signals respectively corresponding to the plurality of dividers, and output dividing error signals; and a jitter monitoring circuit configured to output a jitter error signal.

20 Claims, 17 Drawing Sheets

(56) References Cited

U.S. PATENT DOCUMENTS

| | | | | |
|---|---|---|---|---|
| 2005/0046491 A1* | 3/2005 | Smith | ............ | H03L 7/1976 |
| | | | | 331/25 |
| 2007/0200634 A1 | 8/2007 | Feng et al. | | |
| 2016/0266603 A1* | 9/2016 | Musunuri | ............ | G06F 1/08 |
| 2017/0324418 A1* | 11/2017 | Kao | ............ | H03L 7/18 |

FOREIGN PATENT DOCUMENTS

| | | |
|---|---|---|
| JP | 5011559 B2 | 8/2012 |
| JP | 2020-195080 A | 12/2020 |
| KR | 10-2005-0072254 A | 7/2005 |
| KR | 10-0940920 B1 | 2/2010 |
| KR | 10-2019-0015062 A | 2/2019 |

* cited by examiner

MONITORING CIRCUIT OF PHASE LOCKED LOOP AND OPERATING METHOD THEREOF

CROSS-REFERENCE TO RELATED APPLICATION

This application is based on and claims priority under 35 U.S.C. § 119 to Korean Patent Application No. 10-2021-0124265, filed on Sep. 16, 2021, in the Korean Intellectual Property Office, the disclosure of which is incorporated by reference herein in its entirety.

BACKGROUND

The present disclosure relates to a monitoring circuit, and more particularly, to a monitoring circuit of a phase locked loop (PLL) including a plurality of dividers and an operating method thereof.

A PLL circuit or a clock generator including a PLL circuit may generate a clock signal that is phase locked. For example, a clock signal may be used for a transmitter to transmit data, or for a receiver to recover data. Here, the PLL circuit may be classified into a ring-PLL circuit, an inductor-capacitor (LC)-PLL circuit, and the like.

SUMMARY

Example embodiments provide a monitoring circuit for efficiently monitoring signals generated in a phase locked loop and an operating method thereof.

According to an aspect of an example embodiment, a monitoring circuit includes: a phase locked loop configured to generate an output signal by dividing an input signal based on a plurality of dividers; a plurality of dividing monitoring circuits, each dividing monitoring circuit being associated with a respective divider of the plurality of dividers and configured to receive a dividing input signal and a dividing output signal corresponding to the respective divider and to output a dividing error signal based on a dividing ratio range and a dividing ratio of the dividing output signal to the dividing input signal corresponding to the respective divider; and a jitter monitoring circuit configured to output a jitter error signal based on jitter of a signal generated in the phase locked loop and a jitter error range set in a calibration mode.

According to an aspect of an example embodiment, a method of monitoring a phase locked loop including a plurality of dividers, includes: receiving dividing input signals and dividing output signals respectively corresponding to the plurality of dividers; outputting dividing error signals corresponding to each respective divider of the plurality of dividers, based on a dividing ratio range and a dividing ratio of the dividing output signal to the dividing input signal corresponding to the respective divider; and outputting a jitter error signal based on jitter of a signal generated in the phase locked loop and a jitter error range set in a calibration mode.

According to an aspect of an example embodiment, a monitoring circuit for monitoring a phase locked loop including a plurality of dividers, includes: a first dividing monitoring circuit configured to receive an input signal of the phase locked loop and a reference signal divided by an input signal divider, and output an input dividing error signal based on a first dividing ratio range and a first dividing ratio of the reference signal to the input signal; a second dividing monitoring circuit configured to receive an oscillating signal of the phase locked loop and a feedback signal divided by an oscillating signal divider, and output an oscillating dividing error signal based on a second dividing ratio range and a second dividing ratio of the feedback signal to the oscillating signal; a third dividing monitoring circuit configured to receive the oscillating signal of the phase locked loop and an output signal divided by an output signal divider, and output an output dividing error signal based on a third dividing ratio range and a third dividing ratio of the output signal to the oscillating signal; and a jitter monitoring circuit configured to output a jitter error signal based on jitter of the oscillating signal and a jitter error range set in a calibration mode.

BRIEF DESCRIPTION OF THE DRAWINGS

The above and/or other aspects of certain example embodiments will be more clearly understood from the following detailed description taken in conjunction with the accompanying drawings, in which.

DETAILED DESCRIPTION

Hereinafter, example embodiments will be described in detail with reference to the accompanying drawings.

Figure 1:
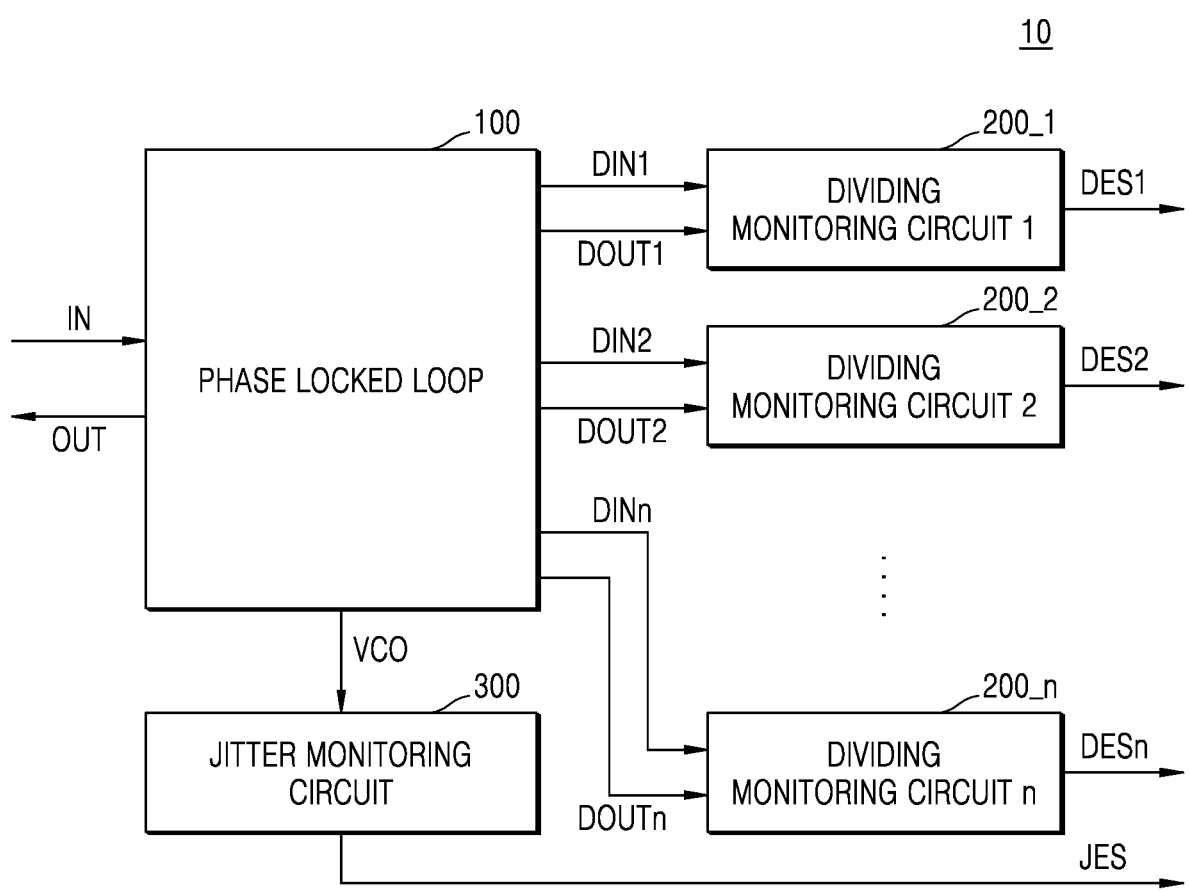
FIG. 1 is a block diagram schematically illustrating a circuit for monitoring a signal of a PLL according to an example embodiment.
Figure 2:
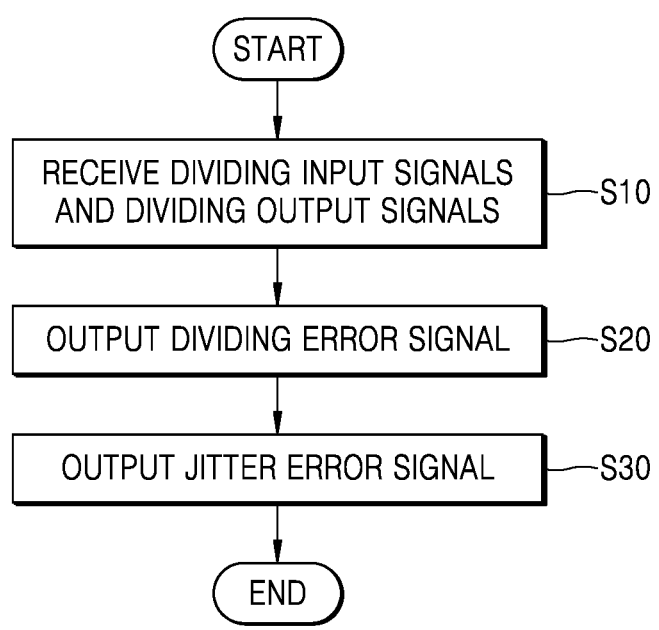
FIG. 2 is a flowchart illustrating an operating method of a monitoring circuit according to an example embodiment.

FIG. 1 is a block diagram schematically illustrating a monitoring circuit 10 for monitoring a signal of a phase locked loop 100 according to an example embodiment. FIG. 2 is flowchart illustrating an operating method of a monitoring circuit 10, according to an example embodiment.

The operating method of the monitoring circuit 10, shown in FIG. 2, may be described with reference to the block diagram of FIG. 1.

Referring to FIG. 1, the monitoring circuit 10 may include the phase locked loop 100, a plurality of dividing monitoring circuits including, for example, first to $n^{th}$ dividing monitoring circuits 200_1 to 200_$n$ (e.g., dividing monitoring circuits 1 to n), and a jitter monitoring circuit 300. The phase locked loop 100 may include a plurality of dividers, and may generate a high-frequency output signal having a multiple of a frequency of an input signal according to a dividing ratio of the dividers.

In operation S10, the plurality of dividing monitoring circuits including, for example, the first to $n^{th}$ dividing monitoring circuits 200_1 to 200_$n$ may receive dividing input signals and dividing output signals from the dividers corresponding to the respective dividing monitoring circuits. In an example embodiment, when the phase locked loop 100 includes n dividers (wherein n is a natural number), the phase locked loop 100 may provide n dividing input signals DIN1 to DINn and n dividing output signals DOUT1 to DOUTn to the first to $n^{th}$ dividing monitoring circuits 200_1 to 200_$n$. A dividing input signal and a dividing output signal may oscillate, and a period of the dividing output signal may be obtained by multiplying a period of the dividing input signal by a dividing ratio.

In operation S20, each dividing monitoring circuit may output a dividing error signal based on a dividing ratio of the dividing output signal to the dividing input signal. A dividing monitoring circuit may determine whether or not a dividing ratio of a dividing output signal to a dividing input signal corresponds to a dividing ratio input to a divider of the phase locked loop 100. According to an example embodiment, each dividing monitoring circuit may set an upper limit error dividing ratio and a lower limit error dividing ratio for a dividing ratio, and may determine whether or not a dividing ratio of a dividing output signal to a dividing input signal is between the upper limit error dividing ratio and the lower limit error dividing ratio. The dividing monitoring circuit may output a dividing error signal when the dividing ratio of the dividing output signal to the dividing input signal is greater than the upper limit error dividing ratio or is less than the lower limit error dividing ratio. However, the disclosure is not limited thereto, and as such, according to another example embodiment, the dividing monitoring circuit may output a dividing error signal when the dividing ratio of the dividing output signal to the dividing input signal is greater than or equal to the upper limit error dividing ratio or is less than or equal to the lower limit error dividing ratio.

In an example embodiment, the first dividing monitoring circuit 200_1 may receive a first dividing input signal DIN1 and a first dividing output signal DOUT1 of a first divider, and may set a first upper limit error dividing ratio and a first lower limit error dividing ratio based on a dividing ratio input to the first divider. The first dividing monitoring circuit 200_1 may output a first dividing error signal DES1 when a dividing ratio of the first dividing output signal DOUT1 to the first dividing input signal DIN1 is greater than the first upper limit error dividing ratio or is less than the first lower limit error dividing ratio. Similarly, the second dividing monitoring circuit 200_2 may receive a second dividing input signal DIN2 and a second dividing output signal DOUT2 to output a second dividing error signal DES2. The $n^{th}$ dividing monitoring circuit 200_$n$ may receive an $n^{th}$ dividing input signal DINn and an $n^{th}$ dividing output signal DOUTn to output an $n^{th}$ dividing error signal DESn.

In operation S30, the jitter monitoring circuit 300 may output a jitter error signal JES based on a signal received from the phase locked loop 100. In an example embodiment, the jitter monitoring circuit 300 may receive an oscillating signal VCO, and may determine whether or not jitter of the oscillating signal VCO is included within a jitter error range. When the jitter monitoring circuit 300 determines that the jitter of the oscillating signal VCO is out of the jitter error range, the jitter monitoring circuit 300 may output the jitter error signal JES. The jitter monitoring circuit 300 may set the jitter error range in a calibration mode, and may determine whether or not the jitter of the oscillating signal VCO is out of the jitter error range in a jitter monitoring mode. When the jitter monitoring circuit 300 determines that the jitter of the oscillating signal VCO is out of the jitter error range, the jitter monitoring circuit 300 may output the jitter error signal JES.

According to an example embodiment, the first to $n^{th}$ dividing error signals DES1 to DESN or the jitter error signal JES may be output to a control logic or a processor that controls the phase locked loop 100. When the control logic or the processor receives the first to $n^{th}$ dividing error signals DES1 to DESn or the jitter error signal JES, the control logic or the processor may remove an error generated in the phase locked loop 100 by controlling the phase locked loop 100. In an example embodiment, the control logic or the processor may adjust dividing ratios of dividers corresponding to the first to $n^{th}$ dividing monitoring circuits 200_1 to 200_$n$ that output the first to $n^{th}$ dividing error signals DES1 to DESn, or may adjust a frequency of an input signal IN input to the phase locked loop 100. For example, in an example embodiment, the control logic or the processor may adjust dividing ratios of dividers based on the first to $n^{th}$ dividing error signals DES1 to DESN or may the control logic or the processor may adjust a frequency of an input signal IN input to the phase locked loop 100 based on the jitter error signal JES. However, the operating method of the example embodiment corresponding to the first to $n^{th}$ dividing error signals DES1 to DESn and the jitter error signal JES is not limited thereto.

When the plurality of dividers included in the phase locked loop 100 divide the first to $n^{th}$ dividing input signals DIN1 to DINn according to a dividing ratio being out of a dividing ratio range, the monitoring circuit 10 may monitor which divider causes an error. Accordingly, when an error occurs in the phase locked loop 100, an electronic device including the monitoring circuit 10 may operate by taking the error into account, and may take remedial measures by focusing on the divider that causes the error.

Figure 3:
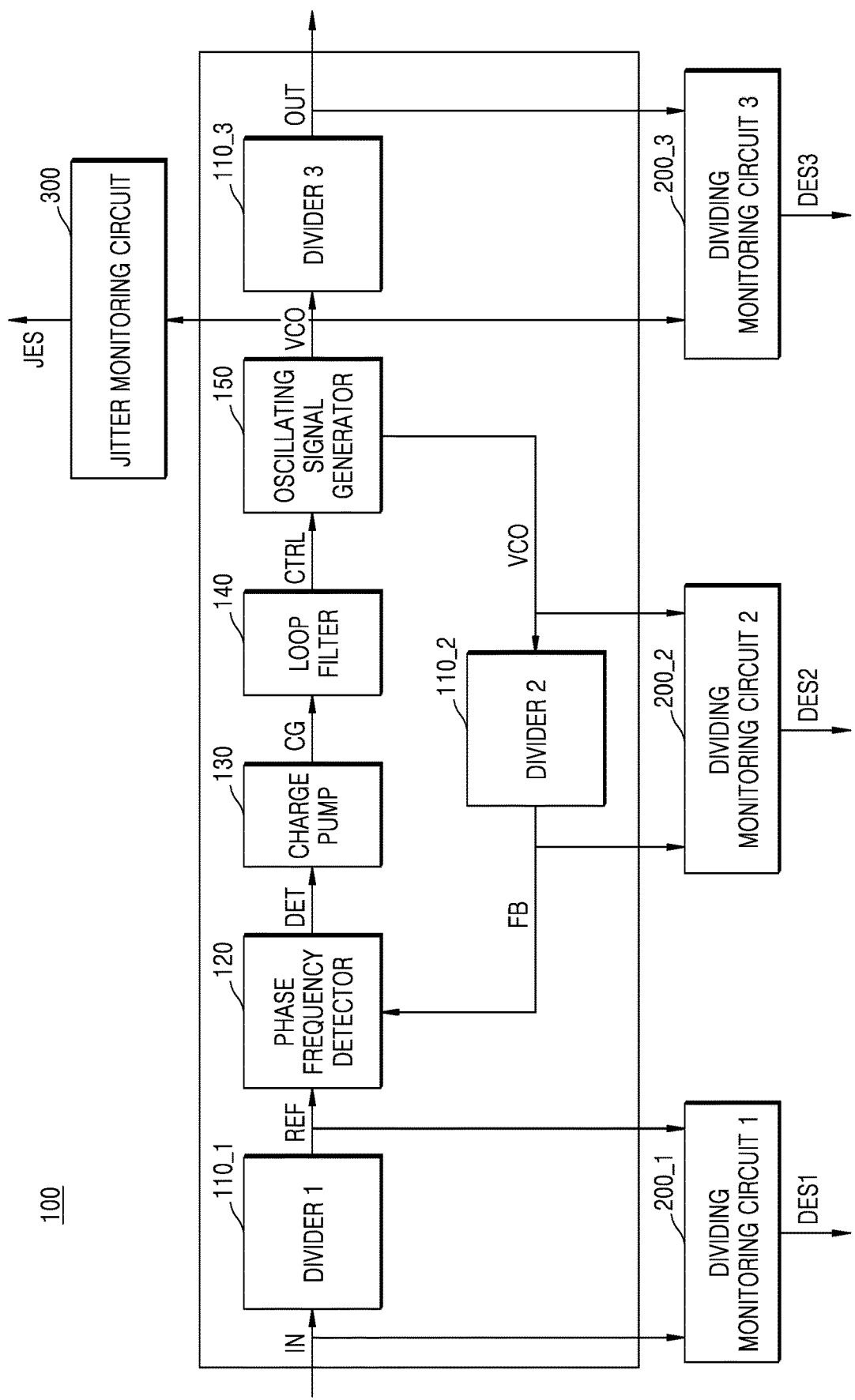
FIG. 3 is a block diagram illustrating a phase locked loop, and a plurality of dividing monitoring circuits and a jitter monitoring circuit for receiving a signal of the phase locked loop, according to an example embodiment.

FIG. 3 is a block diagram illustrating a phase locked loop 100, and a plurality of dividing monitoring circuits including, for example, a first dividing monitoring circuits 200_1, a second dividing monitoring circuits 200_2, and a third dividing monitoring circuits 200_3 and a jitter monitoring circuit 300 for receiving a signal of the phase locked loop 100, according to an example embodiment.

Referring to FIG. 3, the phase locked loop 100 may include a first divider (e.g., a divider 1) 110_1, a second divider (e.g., a divider 2) 110_2, a third divider (e.g., a divider 3) 110_3, a phase frequency detector 120, a charge pump 130, a loop filter 140, and an oscillating signal generator 150. The first divider 110_1 may be referred to as an input signal divider or a pre-divider, and the second divider 110_2 may be referred to as an oscillating signal divider or a main divider, and the third divider 110_3 may be referred to as an output signal divider or a post-divider.

The second divider 110_2 may generate a feedback signal FB based on an oscillating signal VCO and a second dividing ratio. The second divider 110_2 may receive an oscillating signal VCO and a second dividing ratio, and determine, as a frequency of the feedback signal FB, a frequency obtained by dividing a frequency of the oscillating signal VCO by a received dividing ratio. In an example embodiment, the second divider 110_2 may receive a dividing ratio varied by a sigma delta modulator.

In an example embodiment, the second divider 110_2 may include a counter, and the counter may generate the feedback signal FB having a logic state that transitions based on a dividing ratio. The counter may count the number of rising edges of the oscillating signal VCO, and may transition the logic state of the feedback signal FB in response to a rising edge corresponding to an integer dividing ratio.

The second divider 110_2 may provide the generated feedback signal FB to the phase frequency detector 120, and the phase frequency detector 120 may transmit a detection signal DET to the charge pump 130 based on a reference signal REF and the feedback signal FB. The phase frequency detector 120 may include a comparator, and the comparator may generate the detection signal DET indicating a phase difference between the reference signal REF and the feedback signal FB according to a difference between the reference signal REF and the feedback signal FB. In detail, when the difference between the reference signal REF and the feedback signal FB does not occur, the phase frequency detector 120 may generate the detection signal DET of 0. The phase frequency detector 120 may generate the detection signal DET having a pulse width corresponding to the difference between the reference signal REF and the feedback signal FB occurs. Although a pulse amplitude of the detection signal DET is constant, a pulse width may vary according to a difference between two signals, and a polarity of the detection signal DET may be determined according to which of the two signal has a higher level.

The charge pump 130 may receive the detection signal DET from the phase frequency detector 120, and may generate charge CG based on the detection signal DET. The charge pump 130 may determine a polarity of the charge CG according to a polarity of the detection signal DET, and may determine the magnitude of the charge CG based on the pulse width of the detection signal DET. In an example embodiment, the charge pump 130 may provide the charge CG to the loop filter 140 in response to the detection signal DET having a positive pulse, and may determine an amount of charge CG based on the pulse width. In contrast, the charge pump 130 may discharge the charge CG of a loop pump (the loop filter 140) in response to the detection signal DET having a negative pulse, being input, and may determine an amount of charge CG to be discharged, based on the pulse width.

The loop filter 140 may include a capacitor, and the capacitor may store the charge CG provided from the charge pump 130, or the charge CG stored in the capacitor may be discharged by the charge pump 130. The loop filter 140 may provide the oscillating signal generator 150 with a control voltage CTRL varying according to the amount of charge stored in the capacitor. In addition, the loop filter 140 may include a low pass filter for providing the oscillating signal generator 150 with the control voltage CTRL having a DC component to remove noise.

The oscillating signal generator 150 may include an oscillator and an oscillator driving circuit, and the oscillator driving circuit may determine a level of an oscillator driving current based on the received control voltage CTRL. The oscillator driving circuit may provide the oscillator driving current to the oscillator, and may output the oscillating signal VCO having a frequency determined according to the magnitude of the oscillator driving current. In an example embodiment, as the control voltage CTRL increases, the oscillator may output an oscillating signal VCO having a higher frequency.

The first dividing monitoring circuit 200_1 may receive an input signal IN and the reference signal REF, and may determine whether or not to output a first dividing error signal DES1, based on the input signal IN and the reference signal REF. The second dividing monitoring circuit 200_2 may receive the feedback signal FB and the oscillating signal VCO, and may determine whether or not to output a second dividing error signal DES2, based on the feedback signal FB and the oscillating signal VCO. The third dividing monitoring circuit 200_3 may receive the oscillating signal VCO and an output signal OUT, and may determine whether or not to output a third dividing error signal DES3, based on the oscillating signal VCO and the output signal OUT.

Figure 4:
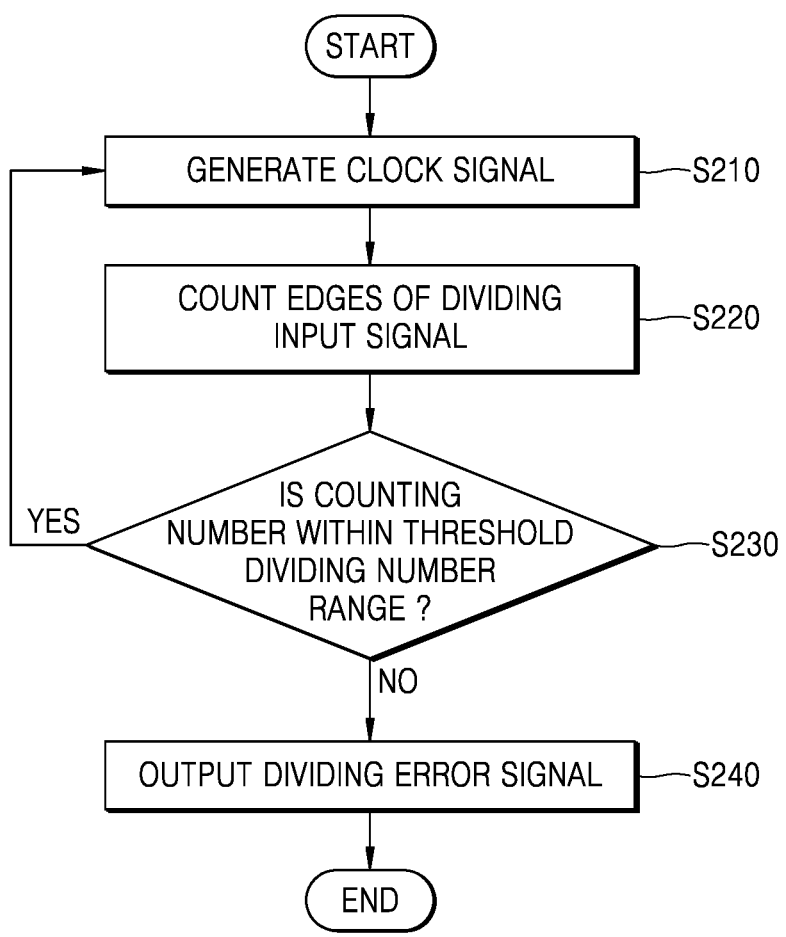
FIG. 4 is a flowchart illustrating a method of generating a dividing error signal, according to an example embodiment.
Figure 5:
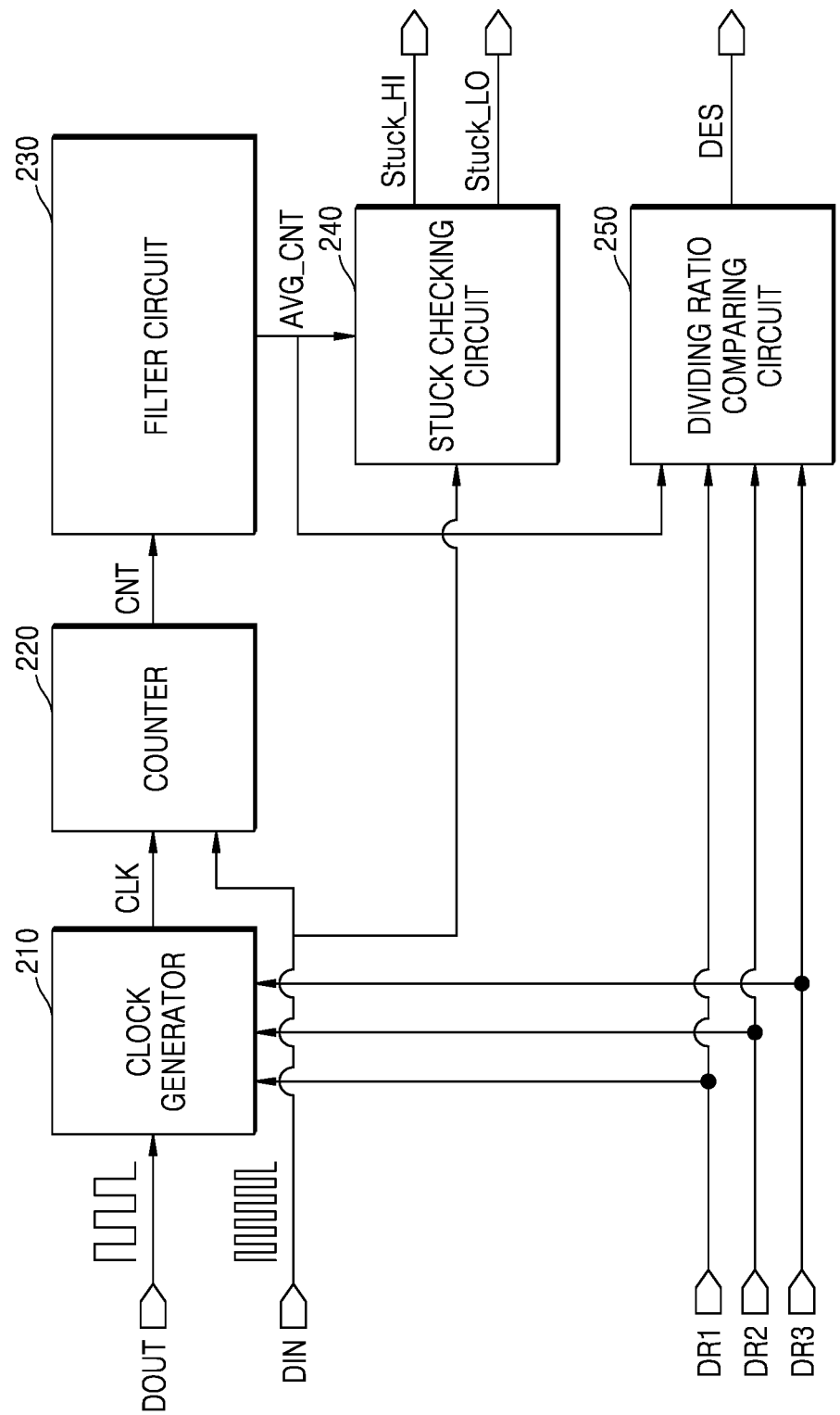
FIG. 5 is a block diagram illustrating a dividing monitoring circuit according to an example embodiment.

FIG. 4 is a flowchart illustrating a method of generating a dividing error signal, according to an example embodiment. FIG. 5 is a block diagram illustrating a dividing monitoring circuit according to an example embodiment.

The method of generating a dividing error signal DES by the dividing monitoring circuit, shown in FIG. 4, may be described with reference to the block diagram of FIG. 5. The first dividing monitoring circuit 200_1 to the $n^{th}$ dividing monitoring circuit 200_n described above with reference to FIG. 1 may include components illustrated in FIG. 5. However, the disclosure is not limited thereto, and as such, one or more components may added or omitted from the illustrated diagram in FIG. 5 without deviating from the scope of the disclosure.

Referring to FIG. 5, the dividing monitoring circuit may include a clock generator 210, a counter 220, a filter circuit 230, a stuck checking circuit 240, and a dividing ratio comparing circuit 250. The clock generator 210 may receive a dividing output signal DOUT, and the counter 220 may receive a dividing input signal DIN. The clock generator 210 and the dividing ratio comparing circuit 250 may receive at least some of dividing ratios provided to respective dividers. The clock generator 210 may generate a clock signal CLK from the dividing output signal DOUT based on the received dividing ratio, and the dividing ratio comparing circuit 250 may generate a dividing ratio range based on the received dividing ratio and compare the dividing ratio range with a counting value.

In operation S210, the clock generator 210 may generate the clock signal CLK based on the dividing output signal DOUT. According to an example embodiment, the clock generator 210 may receive a dividing ratio corresponding to the dividing monitoring circuit to generate the clock signal CLK. In an example embodiment, the first dividing monitoring circuit 200_1 may receive a first dividing ratio DR1, the second dividing monitoring circuit 200_2 may receive a second dividing ratio DR2, and the third dividing monitoring circuit 200_3 may receive a third dividing ratio DR3 to generate the clock signal CLK.

The clock generator 210 may set a dividing ratio of the clock generator 210 so that a dividing ratio of the clock signal CLK to the dividing output signal DOUT is a target dividing ratio. In an example embodiment, the clock generator 210 included in the first dividing monitoring circuit 200_1 may receive the first dividing ratio DR1, and may set, as a dividing ratio of the clock generator 210, a value obtained by dividing the target dividing ratio by the first dividing ratio DR1. When the first dividing ratio DR1 is 2 and the target dividing ratio is 1000, the clock generator 210 may divide the dividing output signal DOUT in the dividing ratio of 500. The clock generators 210 included in the second dividing monitoring circuit 200_2 and the third dividing monitoring circuit 200_3 may also generate the clock signals CLK in the same manner as the clock generator 210 included in the first dividing monitoring circuit 200_1.

In operation S220, when the clock signal CLK is at a particular logic level, the counter 220 may count edges of the dividing input signal DIN. The particular logic level may be a logic high level, and the edge may be one of a rising edge and a falling edge. In an example embodiment, when the target dividing ratio of the clock generator 210 is 1000, the number of edges of the dividing input signal DIN counted by the counter 220 may be expected to be 1000.

In operation S230, the dividing ratio comparing circuit 250 may determine whether or not the counting number CNT counted in operation S220 is within a threshold dividing number range. The dividing ratio comparing circuit 250 may receive the counting number CNT from the counter 220. However, the dividing ratio comparing circuit 250 of the example embodiment is not limited thereto and may receive an average counting number AVG_CNT generated by the filter circuit 230 as shown in FIG. 5.

The threshold dividing number range may be defined by an upper limit dividing number and a lower limit dividing number generated based on a dividing ratio to be input to a divider. In an example embodiment, when the target dividing ratio is set to 1000, the dividing ratio comparing circuit 250 may set the upper limit dividing number to 1004 and the lower limit dividing number to 996.

When the counting number CNT or the average counting number AVG_CNT is out of the threshold dividing number range, in operation S240, the dividing ratio comparing circuit 250 may output a dividing error signal DES. In contrast, when the counting number CNT input to the dividing ratio comparing circuit 250 is within the threshold dividing number range, the dividing ratio comparing circuit 250 may not output the dividing error signal DES, but the dividing monitoring circuit may perform a counting operation by generating the clock signal CLK again.

The method of generating the average counting number AVG_CNT by the filter circuit 230 will be described below with reference to FIG. 6, and a method of determining, by the stuck checking circuit 240, whether or not the dividing input signal DIN is stuck to output a stuck high signal STUCK_HI and a stuck low signal STUCK_LO having a logic high level will be described below with reference to FIG. 8.

Figure 6:
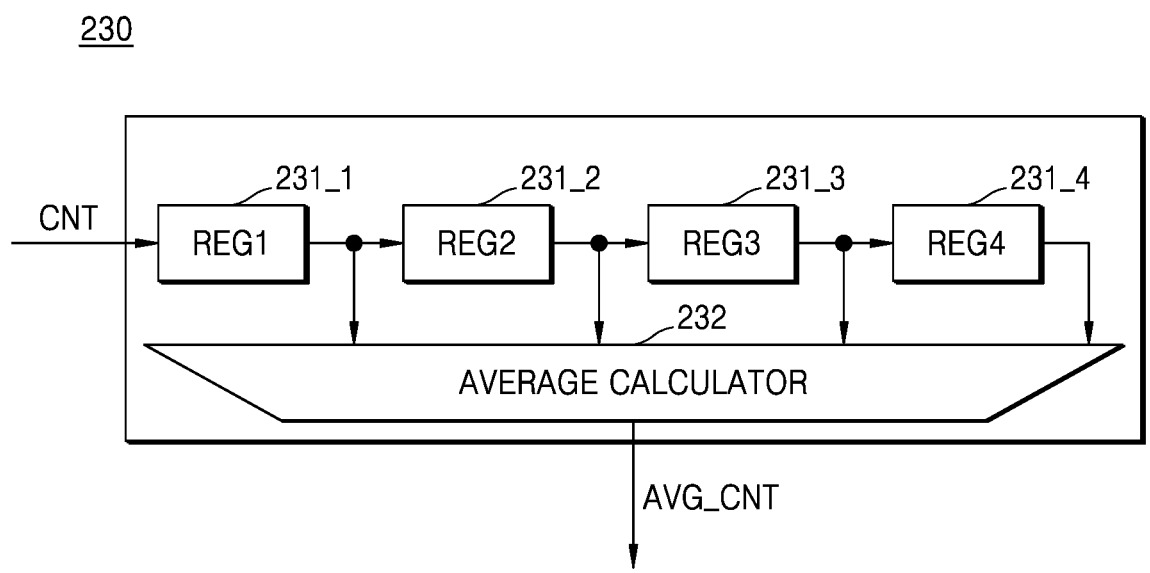
FIG. 6 is a block diagram illustrating a filter circuit according to an example embodiment.

FIG. 6 is a block diagram illustrating a filter circuit according to an example embodiment.

Referring to FIG. 6, a filter circuit 230 may include a plurality of registers including, for example, a first register (REG1) 231_1, a second register (REG2) 231_2, a third register (REG3) 231_3, and a fourth register (REG4) 231_4, and an average calculator 232. The plurality of registers may include the first register 231_1, the second register 231_2, the third register 231_3, and the fourth register 231_4, but the number of first to fourth registers 231_1 to 231_4 according to the example embodiment is not limited thereto. For instance, according to another example embodiment, the number of the register may be less than four or greater than four.

A register may at least temporarily store a counting number CNT, and, when receiving the counting number CNT from a counter, may transfer the stored counting number CNT to a right register. In an example embodiment, when the counting number CNT is received by the first register 231_1, the counting number CNT stored in the first register 231_1 may be transferred to the second register 231_2, the counting number CNT stored in the second register 231_2 may be transferred to the third register 231_3, the counting number CNT stored in the third register 231_3 may be transferred to the fourth register 231_4, and the counting number CNT stored in the fourth register 231_4 may be deleted.

The average calculator 232 may receive the counting numbers CNT stored in the first register 231_1, the second register 231_2, the third register 231_3, and the fourth register 231_4 to output an average counting number AVG_CNT. The dividing ratio comparing circuit 250 may receive the output average counting number AVG_CNT to determine whether or not the average counting number AVG_CNT is within a threshold dividing number range.

Figure 7:
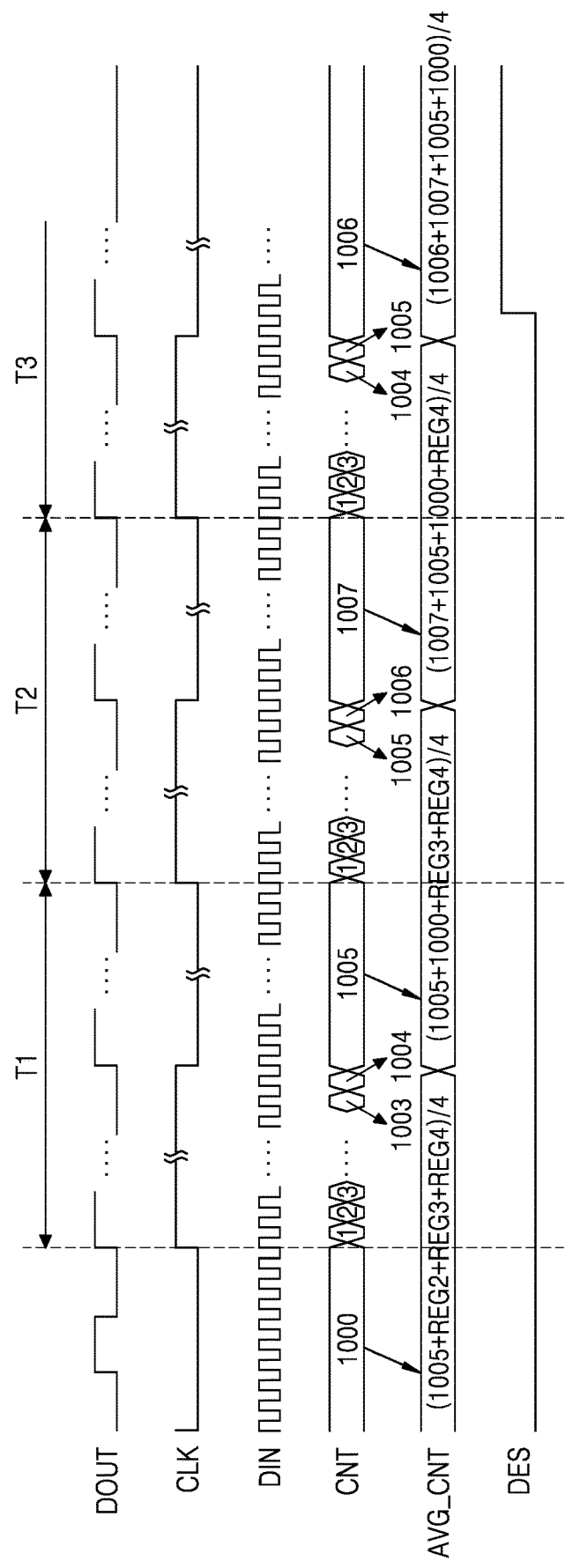
FIG. 7 is a timing diagram illustrating signals of a dividing monitoring circuit according to an example embodiment.

FIG. 7 is a timing diagram illustrating signals of the dividing monitoring circuit, according to an example embodiment.

Referring to FIG. 7, at a first time T1, a second time T2, and a third time T3, the dividing monitoring circuit may count edges of a dividing input signal DIN to determine whether or not to output a dividing error signal DES. Hereinafter, FIG. 7 will be described with reference to FIGS. 5 and 6.

The dividing ratio comparing circuit 250 may set a threshold dividing number range to ±0.4% with respect to a target dividing ratio, and, when the target dividing ratio is 1000, may set an upper limit dividing number to 1004 and a lower limit dividing number to 996. When a divider accurately divides the dividing input signal DIN, the target dividing ratio may correspond to the number of edges detected in response to a clock signal CLK being at a logic high level.

When the edge of the dividing input signal DIN is detected 1000 times before the first time T1, the counter 220 may store 1000 in the first register 231_1.

At the first time T1, the clock generator 210 may generate the clock signal CLK based on a dividing output signal DOUT, and the counter 220 may count rising edges or falling edges of the dividing input signal DIN in response to the clock signal CLK being at the logic high level. In an example embodiment, while the clock signal CLK is at the logic high level, the counter 220 may count 1005 edges, the first register 231_1 may store 1005, and the second register 231_2 may store 1000. The dividing ratio comparing circuit 250 may compare a threshold dividing number range with 1002.5 that is an average value of 1000 and 1005. Since 1002.5 is lower than or equal to an upper limit dividing number and is higher than or equal to a lower limit dividing number, the dividing ratio comparing circuit 250 may not output the dividing error signal DES.

At the second time T2, while the clock signal CLK is at the logic high level, the counter 220 may count 1007 edges, the first register 231_1 may store 1007, the second register 231_2 may store 1005, and the third register 231_3 may store 1000. The dividing ratio comparing circuit 250 may compare the threshold dividing number range with the average counting number AVG_CNT of 1004 that is an average value of the counting numbers CNT stored in a plurality of registers. Since 1004 is lower than or equal to the upper limit dividing number and is higher than or equal to the lower limit dividing number, the dividing ratio comparing circuit 250 may not output the dividing error signal DES.

At the third time T3, while the clock signal CLK is at the logic high level, the counter 220 may count 1006 edges, the first register 231_1 may store 1006, the second register 231_2 may store 1007, the third register 231_3 may store 1005, and the fourth register 231_4 may store 1000. The dividing ratio comparing circuit 250 may compare the threshold dividing number range with the average counting number AVG_CNT of 1004.5 that is an average value of the counting numbers CNT stored in the plurality of registers. Since 1004.5 is greater than 1004 that is the upper limit dividing number, the dividing ratio comparing circuit 250 may output the dividing error signal DES.

Figure 8:
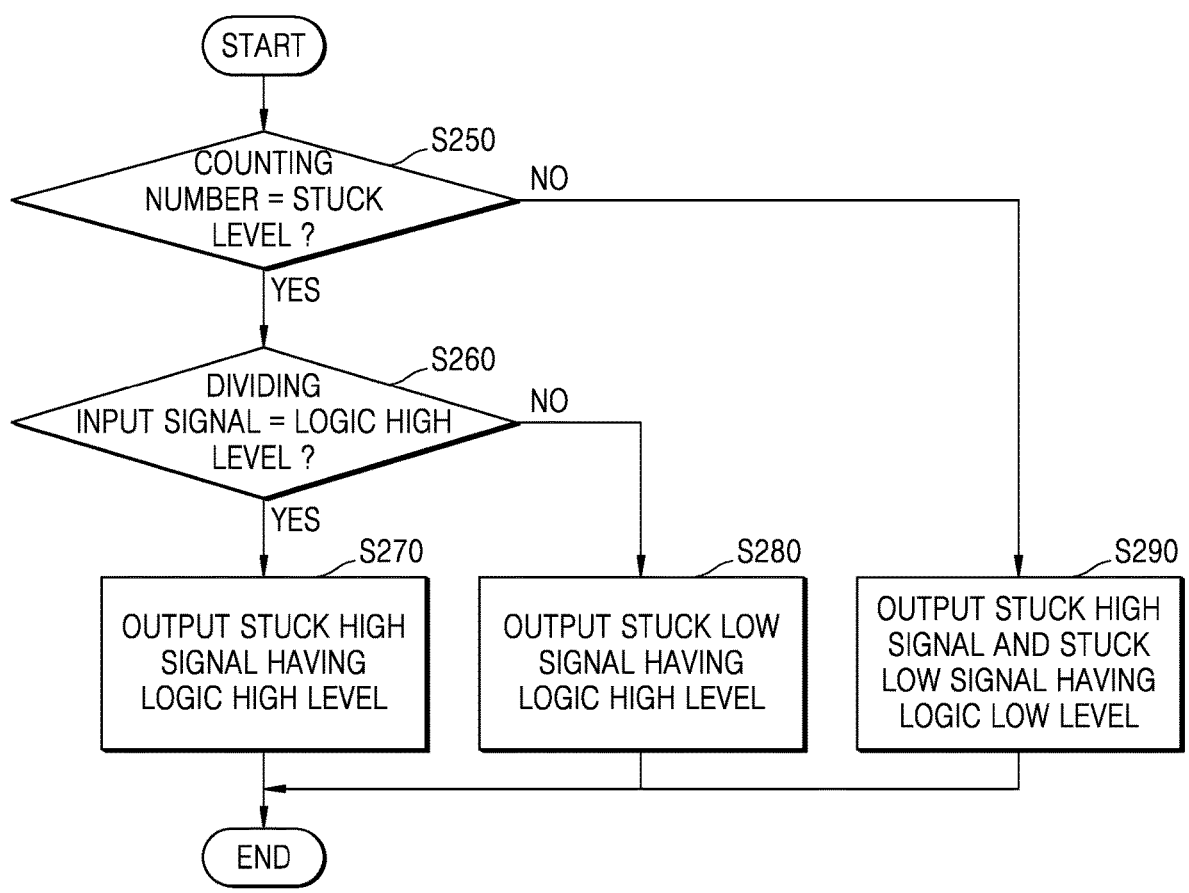
FIG. 8 is a flowchart illustrating a method of generating a stuck low signal and a stuck high signal, according to an example embodiment.

FIG. 8 is a flowchart illustrating a method of generating a stuck low signal and a stuck high signal, according to an example embodiment.

Referring to FIGS. 5 and 8, when a signal input to a divider of the phase locked loop 100 is stuck, and thus the clock signal CLK is not received, the stuck checking circuit 240 may generate one of the stuck low signal STUCK_LO and the stuck high signal STUCK_HI which have a logic high level. When the dividing input signal DIN is stuck, the dividing input signal DIN may be generated as a signal having a DC value rather than the clock signal CLK.

In operation S250, the stuck checking circuit 240 may receive the counting number CNT, and may determine whether or not the counting number CNT is a preset stuck level. In an example embodiment, when a dividing input signal is stuck, an edge may not occur, and thus, a stuck level may be set to 0. When the counting number CNT is not the stuck level, in operation S290, the stuck high signal STUCK_HI and the stuck low signal STUCK_LO, which have a logic low level, may be output.

When the counting number CNT is the stuck level, in operation S260, the stuck checking circuit 240 may determine whether or not the dividing input signal DIN is a signal having a logic high level. When the dividing input signal DIN is at the logic high level, in operation S270, the stuck checking circuit 240 may output the stuck high signal STUCK_HI having a logic high level. The stuck high signal STUCK_HI may be a signal indicating whether or not the dividing input signal DIN is stuck to a DC output having a logic high level. When the dividing input signal DIN has a logic low level, in operation S280, the stuck checking circuit 240 may output the stuck low signal STUCK_LO having a logic high level. The stuck low signal STUCK_LO may be a signal indicating whether or not the dividing input signal DIN is stuck to a DC output having a logic low level.

The dividing monitoring circuit of the example embodiment may receive the dividing input signal DIN and the dividing output signal DOUT of the divider to monitor whether or not the dividing input signal DIN is divided at a dividing ratio input to the divider. In addition, the dividing monitoring circuit may monitor whether or not the dividing input signal DIN that is toggled at a preset period is received.

Figure 9:
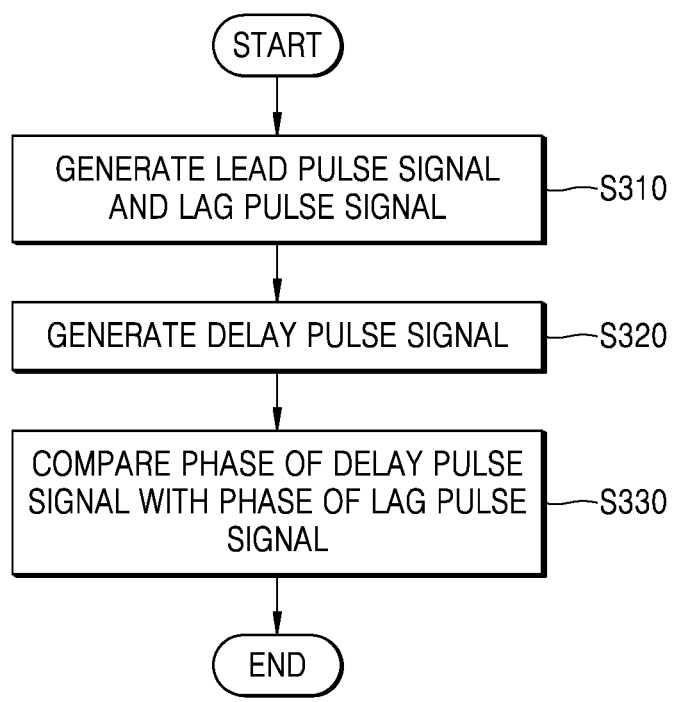
FIG. 9 is a flowchart illustrating a method of comparing a phase of a delay pulse signal with a phase of a lag pulse signal, according to an example embodiment.
Figure 10:
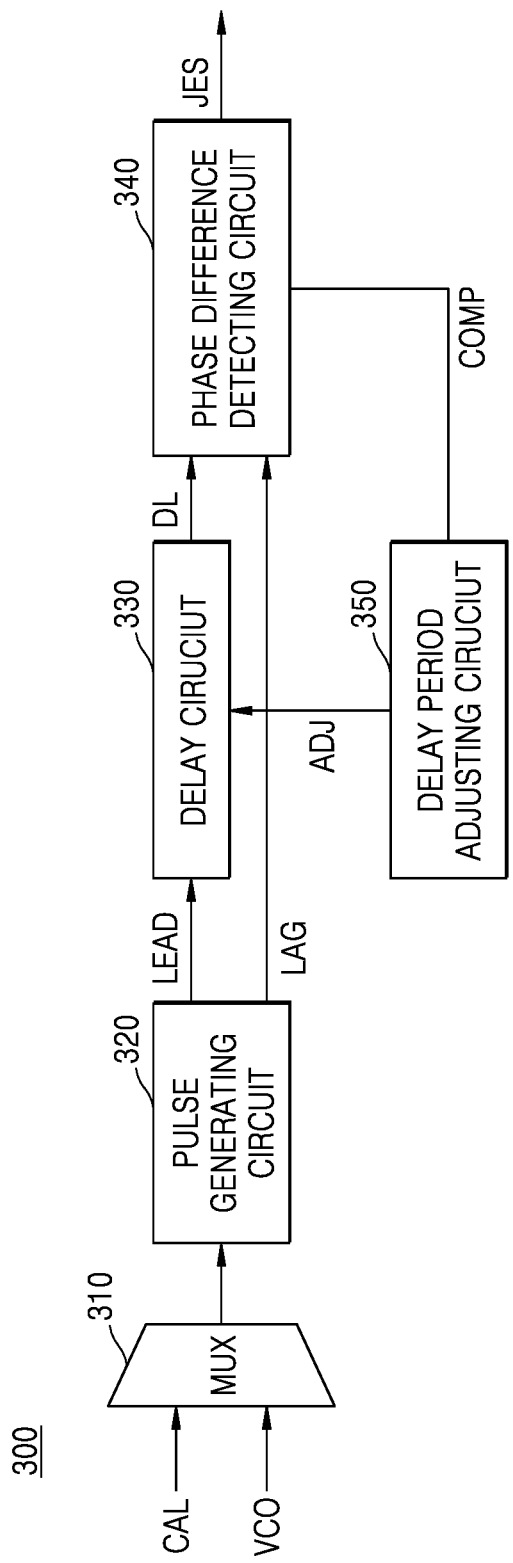
FIG. 10 is a block diagram illustrating configurations of a jitter monitoring circuit according to an example embodiment.

FIG. 9 is a flowchart illustrating a method of comparing a phase of a delay pulse signal with a phase of a lag pulse signal, according to an example embodiment. FIG. 10 is a block diagram illustrating a jitter monitor circuit 300 according to an example embodiment.

The operating method of the jitter monitoring circuit 300, shown in FIG. 9, may be described with reference to the block diagram of FIG. 10.

According to an example embodiment, the jitter monitoring circuit 300 may include an upper limit jitter monitoring circuit for determining an upper limit level of a jitter error range, and determining whether or not jitter of a received signal is greater than the upper limit level. In addition, the jitter monitoring circuit 300 may include a lower limit jitter monitoring circuit for determining a lower limit level of the jitter error range, and determining whether or not the jitter of the received signal is less than the lower limit level.

Referring to FIG. 10, the jitter monitoring circuit 300 may include a multiplexer (MUX) 310, a pulse generating circuit 320, a delay circuit 330, a phase difference detecting circuit 340, and a delay period adjusting circuit 350. According to an example embodiment, each of the upper limit jitter monitoring circuit and the lower limit jitter monitoring circuit included in the jitter monitoring circuit 300 may be configured to include components of FIG. 10 as described later with reference to FIGS. 12 and 14.

The multiplexer MUX 310 may receive a calibration signal CAL and an oscillating signal VCO of the phase locked loop 100, and may output one of the calibration signal CAL and the oscillating signal VCO according to a received mode. The mode may be determined as one of a calibration mode and a jitter monitoring mode by a control logic or a processor. The calibration mode may be a mode for adjusting a delay period, and the jitter monitoring mode may be a mode for determining whether or not jitter of the oscillating signal VCO is out of the jitter error range while the delay period is locked. The calibration signal CAL may be a stable clock signal having very little jitter compared to the oscillating signal VCO, may be the input signal IN of the phase locked loop 100, and may be a signal generated inside the jitter monitoring circuit 300.

In operation S310, the pulse generating circuit 320 may receive a signal output by the multiplexer 310, and may output a lead pulse signal LEAD and a lag pulse signal LAG. The lag pulse signal LAG may be a signal that is output after being delayed from the lead pulse signal LEAD by one period of a received input signal. In other words, in the calibration mode, a phase difference between the lag pulse signal LAG and the lead pulse signal LEAD may be one period of the calibration signal CAL. In the jitter monitoring mode, the phase difference between the lag pulse signal LAG and the lead pulse signal LEAD may be one period of the oscillating signal VCO.

In operation S320, the delay circuit 330 may receive the lead pulse signal LEAD, and may generate a delay pulse signal DL delayed by a set delay period from the lead pulse signal LEAD. According to an example embodiment, the delay period may be a delay period set in the calibration mode, and when the pulse generating circuit 320 receives a jitter-free signal, the delay period may match the phase difference between the lead pulse signal LEAD and the lag pulse signal LAG. Accordingly, in the calibration mode, the delay circuit 330 and the delay period adjusting circuit 350 may adjust the delay period so that the delay period may match the phase difference between the lead pulse signal LEAD and the lag pulse signal LAG. The method of adjusting the delay period in the calibration mode will be described below with reference to FIGS. 11 and 12.

In operation S330, the phase difference detecting circuit 340 may output a jitter error signal JES or a comparison result COMP by comparing the received delay pulse signal DL with the lag pulse signal LAG. The comparison result COMP may be a signal that is output in the calibration mode and provided to the delay period adjusting circuit 350, and the jitter error signal JES may be a signal that is output in the jitter monitoring mode. In other words, the jitter error signal JES and the comparison result COMP may be signals generated in the same manner, and may be signals that are differently referred to as according to an operation mode. For example, in the calibration mode, the phase difference detecting circuit 340 may output a comparison result COMP by comparing the received delay pulse signal DL with the lag pulse signal LAG, and in the jitter monitoring mode, the phase difference detecting circuit 340 may output a jitter error signal JES by comparing the received delay pulse signal DL with the lag pulse signal LAG.

The phase difference detecting circuit 340 may be, for example, a bang-bang phase detector. When a logic high-level pulse signal is input to a (+) terminal and a logic low-level pulse signal is input to a (−) terminal, the phase difference detecting circuit 340 may output the comparison result COMP or the jitter error signal JES of 1. In other words, when a phase of a pulse signal input to the (+) terminal is ahead of a phase of a pulse signal input to the (−) terminal, the phase difference detecting circuit 340 may output the comparison result COMP or the jitter error signal JES having a logic high level. The delay period adjusting circuit 350 may receive the comparison result COMP to provide the delay circuit 330 with an adjusting signal ADJ corresponding to the comparison result COMP.

Figure 11:
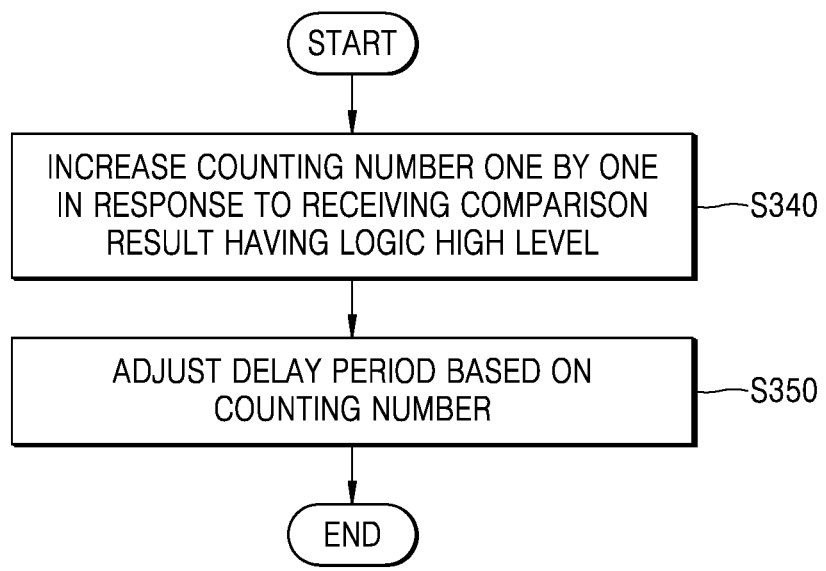
FIG. 11 is a flowchart illustrating a method of adjusting a delay period in a calibration mode, according to an example embodiment.
Figure 12:
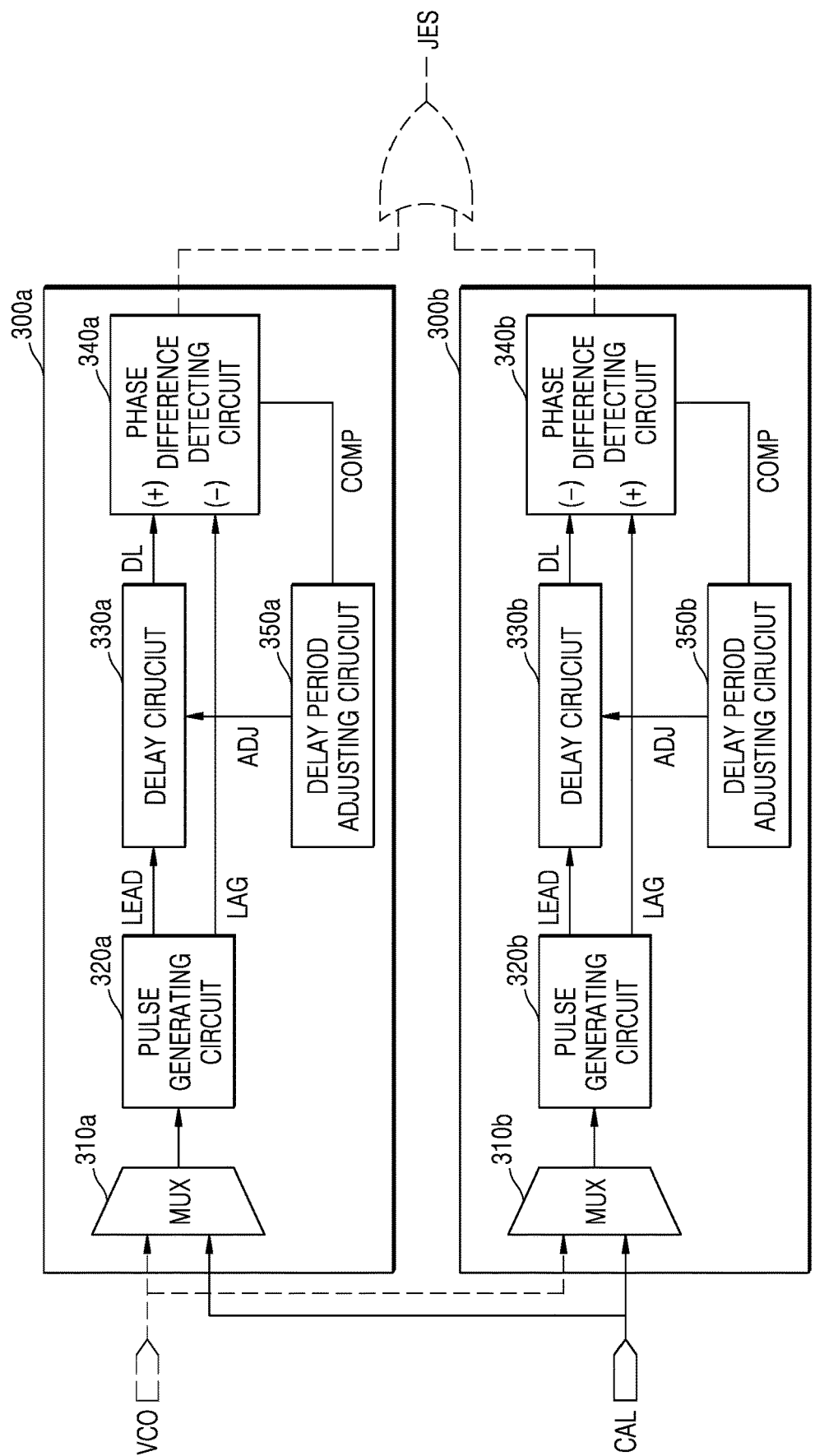
FIG. 12 is a block diagram illustrating configurations activated in a calibration mode, according to an example embodiment.

FIG. 11 is a flowchart illustrating a method of adjusting a delay period in a calibration mode, according to an example embodiment. FIG. 12 is a block diagram illustrating components activated in a calibration mode, according to an example embodiment.

An operating method in the calibration mode, shown in FIG. 11, may be described with reference to the block diagram of FIG. 12.

Referring to FIG. 12, configurations and signals activated in a calibration mode may be indicated by solid lines, and configurations and signals that are deactivated may be indicated by dashed lines. Multiplexers 310a and 310b may receive a calibration signal CAL and an oscillating signal VCO and provide the calibration signal CAL to pulse generating circuits 320a and 320b. In the calibration mode, phase difference detecting circuits 340a and 340b may not output a jitter error signal JES, and may generate a comparison result COMP and provide the comparison result COMP to delay period adjusting circuits 350a and 350b.

In operation S340, the delay period adjusting circuits 350a and 350b may increase a counting number when receiving the comparison result COMP having a logic high level. In an example embodiment, when a delay pulse signal DL is ahead of a lag pulse signal LAG, the phase difference detecting circuit 340a included in an upper limit jitter monitoring circuit 300a may output the comparison result COMP having the logic high level. When the lag pulse signal LAG is ahead of the delay pulse signal DL, the phase difference detecting circuit 340b included in a lower limit jitter monitoring circuit 300b may output the comparison result COMP having the logic high level. The delay period adjusting circuits 350a and 350b may include adders, and the adders may increase a counting number by the number of times the comparison result COMP having the logic high level is output.

In operation S350, the delay period adjusting circuits 350a and 350b may adjust delay periods of delay circuits 330a and 330b based on the result of the adder. The delay period adjusting circuits 350a and 350b may provide the delay circuits 330a and 330b with the result of the adder as an adjusting signal ADJ. The adjusting signal ADJ may be a digital code generated based on the result of the addition, and the delay circuits 330a and 330b may be digital control delay circuits having delay periods that are adjusted according to the digital code.

Referring to FIG. 12, when the jitter monitoring circuit 300 sets the jitter error range of 1% for the oscillating signal VCO having a period of 1 ns, the upper limit jitter monitoring circuit 300a may receive the calibration signal CAL having a period of 1.01 ns, and the lower limit jitter monitoring circuit 300b may receive the calibration signal CAL having a period of 0.99 ns. When the delay circuits 330a and 330b are initially set to the delay period of 1 ns, a (+) terminal of the phase difference detecting circuit 340a of the upper limit jitter monitoring circuit 300a may receive the delay pulse signal DL that is delayed by 1 ns with respect to the lead pulse signal LEAD, and a (−) terminal thereof may receive the lag pulse signal LAG that is delayed by 1.01 ns with respect to the lead pulse signal LEAD. Because the delay pulse signal DL has a phase ahead of the phase of the lag pulse signal LAG, the phase difference detecting circuit 340a of the upper limit jitter monitoring circuit 300a may provide the delay period adjusting circuit 350a with the comparison result COMP having the logic high level corresponding to 0.01 ns. The delay period adjusting circuit 350a may output, as the adjusting signal ADJ, the digital code that increases the delay period by 0.01 ns, and the delay circuit 330a may set the delay period of the upper limit jitter monitoring circuit 300a to 1.01 ns based on the adjusting signal ADJ.

A (+) terminal of the phase difference detecting circuit 340b of the lower limit jitter monitoring circuit 300b may receive the lag pulse signal LAG that is delayed by 0.99 ns with respect to the lead pulse signal LEAD, and a (−) terminal thereof may receive the delay pulse signal DL that is delayed by 1 ns with respect to the lead pulse signal LEAD. Because the lag pulse signal LAG has a phase ahead of the phase of the delay pulse signal DL, the phase difference detecting circuit 340b of the lower limit jitter monitoring circuit 300b may provide the delay period adjusting circuit 350b with the comparison result COMP having the logic high level corresponding to 0.01 ns. The delay period adjusting circuit 350b may output, as the adjusting signal ADJ, the digital code that decreases the delay period by 0.01 ns, and the delay circuit 330b may set the delay period of the lower limit jitter monitoring circuit 300b to 0.99 ns based on the adjusting signal ADJ.

Figure 13:
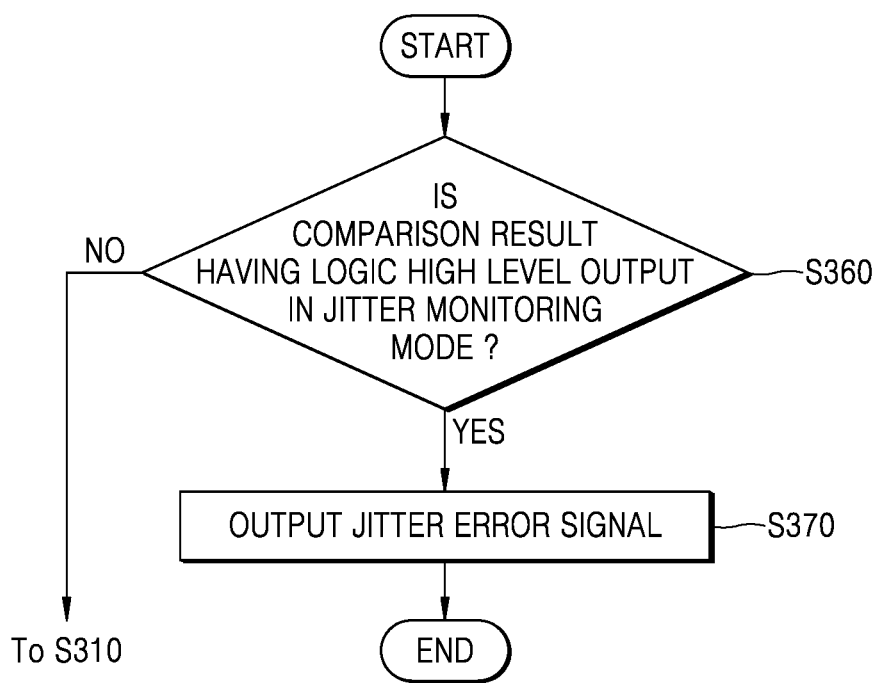
FIG. 13 is a flowchart illustrating a method of outputting a jitter error signal in a jitter monitoring mode, according to an example embodiment.
Figure 14:
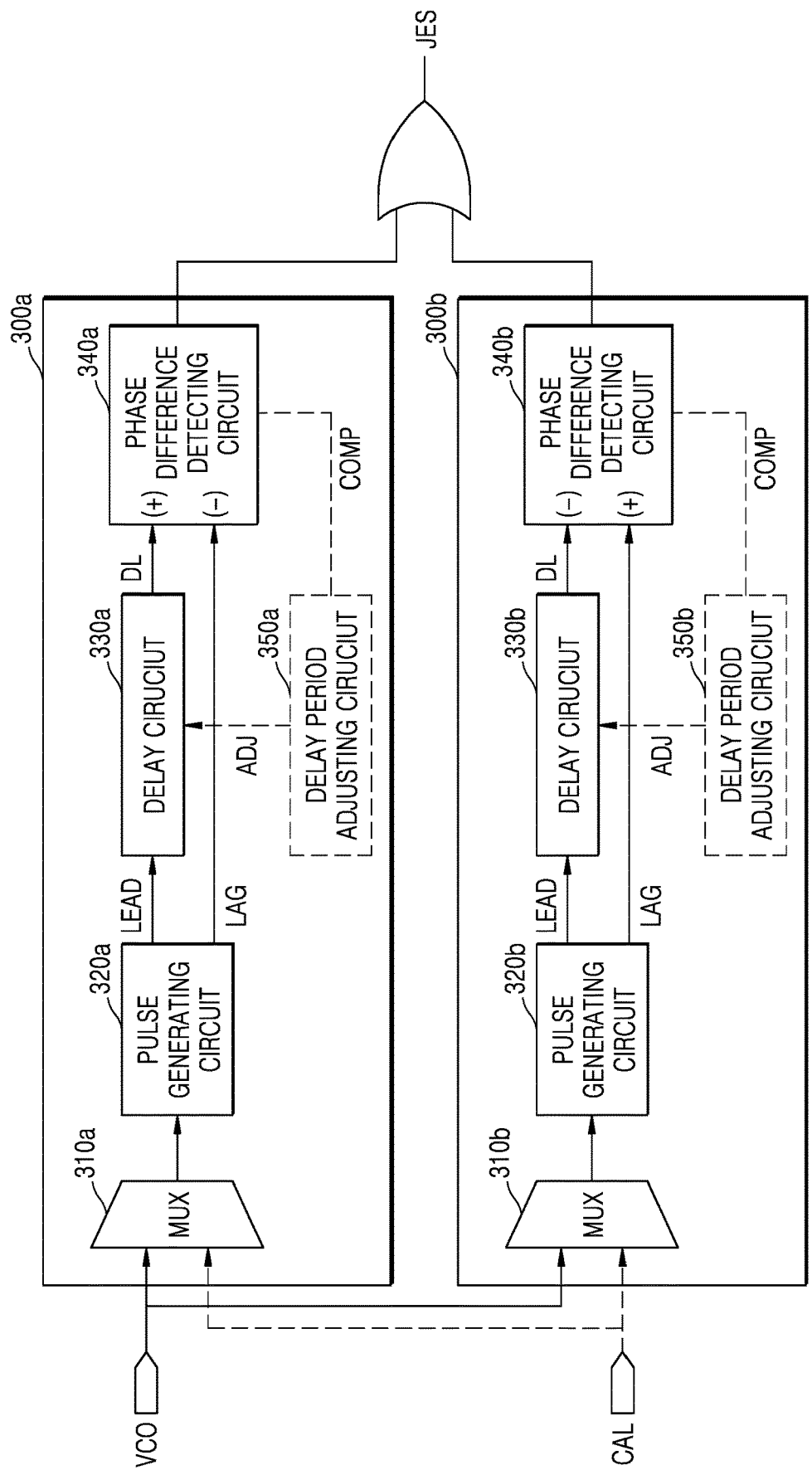
FIG. 14 is a block diagram illustrating configurations activated in a jitter monitoring mode, according to an example embodiment.

FIG. 13 is a flowchart illustrating a method of outputting a jitter error signal JES in a jitter monitoring mode, according to an example embodiment. FIG. 14 is a block diagram illustrating components activated in a jitter monitoring mode, according to an example embodiment.

An operating method in a jitter monitoring mode, shown in FIG. 13, may be described with reference to the block diagram of FIG. 14.

Referring to FIG. 14, configurations and signals activated in a jitter monitoring mode may be indicated by solid lines, and configurations and signals that are deactivated may be indicated by dashed lines. Multiplexers 310a and 310b may receive a calibration signal CAL and an oscillating signal VCO and provide the oscillating signal VCO to pulse generating circuits 320a and 320b. In a jitter monitoring mode, phase difference detecting circuits 340a and 340b may output a jitter error signal JES without generating a comparison result COMP.

In operation S360, while delay periods of a lower limit jitter monitoring circuit 300b and an upper limit jitter monitoring circuit 300a are set, the jitter monitoring circuit 300 may monitor whether or not at least one of the phase difference detecting circuits 340a and 340b of the lower limit jitter monitoring circuit 300b and the upper limit jitter monitoring circuit 300a outputs a logic high-level signal.

When at least one of the phase difference detecting circuits 340a and 340b outputs the logic high-level signal, in operation S370, the jitter monitoring circuit 300 may output the jitter error signal JES. In an example embodiment, when an OR gate receives the logic high-level signal from at least one of the phase difference detecting circuit 340a of the upper limit jitter monitoring circuit 300a and the phase difference detecting circuit 340b of the lower limit jitter monitoring circuit 300b, the OR gate may output the jitter error signal JES.

Referring to FIG. 14, when the jitter monitoring circuit 300 sets a jitter error range of 1% with respect to the oscillating signal VCO having a period of 1 ns, a delay period of the lower limit jitter monitoring circuit 300b may be set to 0.99 ns, and a delay period of the upper limit jitter monitoring circuit 300a may be set to 1.01 ns. When jitter of the oscillating signal VCO is within 0.01 ns, a phase of a signal input to (−) terminals of the phase difference detecting circuits 340a and 340b is ahead of a phase of a signal input to (+) terminals thereof. Therefore, the phase difference detecting circuits 340a and 340b may output a logic low-level signal.

In contrast, when the jitter of the oscillating signal VCO is greater than 0.01 ns, a phase of a signal input to the (+) terminal of one of the phase difference detecting circuits 340a and 340b is ahead of a phase of a signal input to the (−) terminal thereof. Therefore, one of the phase difference detecting circuits 340a and 340b may output a logic high-level signal.

Figure 15:
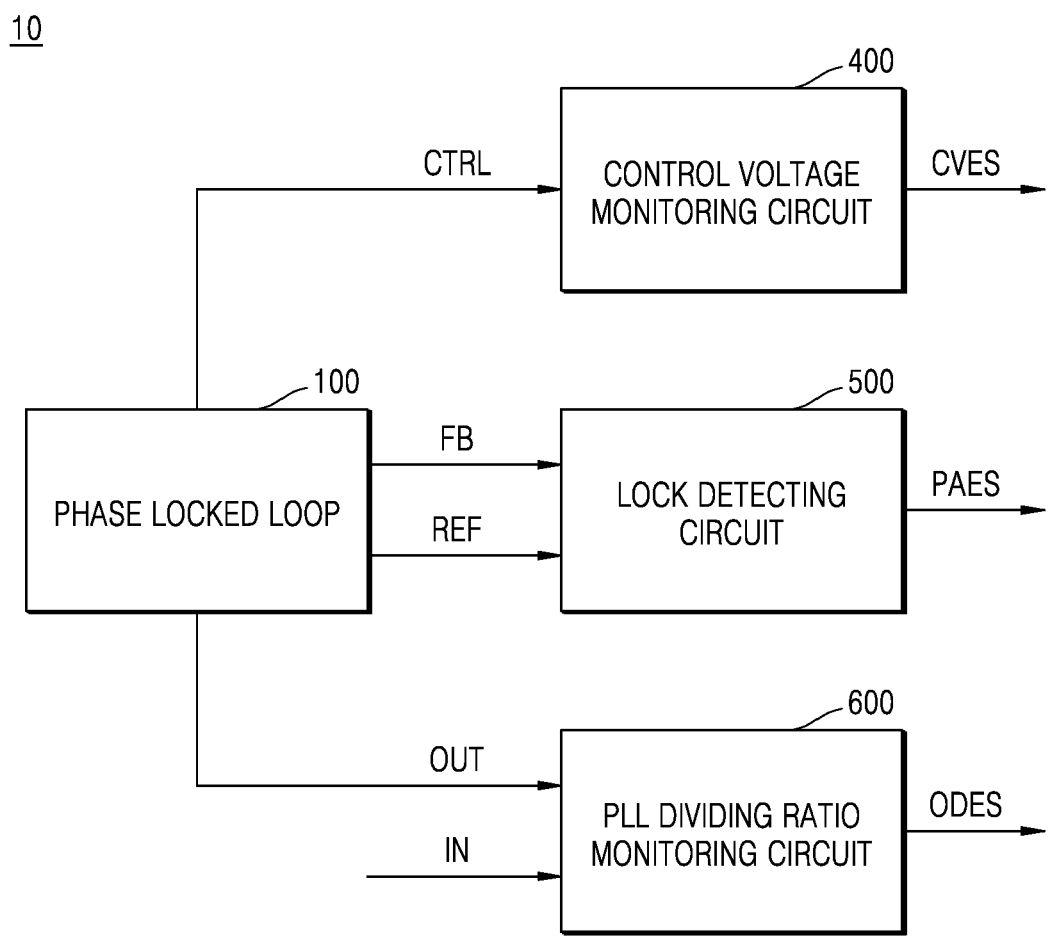
FIG. 15 is a block diagram illustrating a monitoring circuit further including a control voltage monitoring circuit, a lock detecting circuit, and a PLL dividing ratio monitoring circuit, according to an example embodiment.

FIG. 15 is a block diagram illustrating a monitoring circuit 10 further including a control voltage monitoring circuit 400, a lock detecting circuit 500, and a PLL dividing ratio monitoring circuit 600, according to an example embodiment.

Referring to FIG. 15, the monitoring circuit 10 of the example embodiment may further include the control voltage monitoring circuit 400, the lock detecting circuit 500, and the PLL dividing ratio monitoring circuit 600. The control voltage monitoring circuit 400 may receive a control voltage CTRL, and the lock detecting circuit 500 may receive a feedback signal FB and a reference signal REF, and the PLL dividing ratio monitoring circuit 600 may receive an input signal IN and an output signal OUT of a phase locked loop 100.

The control voltage monitoring circuit 400 may monitor whether or not a voltage level of the control voltage CTRL is out of a preset voltage error range. When the control voltage monitoring circuit 400 determines that the control voltage CTRL is out of the preset voltage error range, the control voltage monitoring circuit 400 may output a control voltage error signal CVES. Accordingly, the control voltage monitoring circuit 400 may monitor whether or not an oscillating signal VCO within a certain frequency range may be generated.

The lock detecting circuit 500 may monitor whether or not a phase of the feedback signal FB generated from the oscillating signal VCO and a phase of the reference signal REF are out of a reference phase error range. According to an example embodiment, the reference phase error range may be a preset phrase error range. When the lock detecting circuit 500 determines that the phases of the feedback signal FB and the reference signal REF are out of the phase error range, the lock detecting circuit 500 may output a phase align error signal PAES. In an example embodiment, the lock detecting circuit 500 may include a delay circuit, and may determine whether or not the phases of the feedback signal FB and the reference signal REF are within the phase error range, by comparing the other signal with one of the feedback signal FB and the reference signal REF that is delayed by the delay circuit.

When a dividing ratio of the output signal OUT to the input signal IN is out of a reference dividing ratio range, the PLL dividing ratio monitoring circuit 600 may output an overall dividing error signal ODES. According to an example embodiment, the reference dividing ratio range may be a preset dividing ratio range. In an example embodiment, the PLL dividing ratio monitoring circuit 600 may determine whether or not the dividing ratio is out of the preset dividing ratio range by counting edges, like the dividing monitoring circuits for a plurality of dividers.

Figure 16:
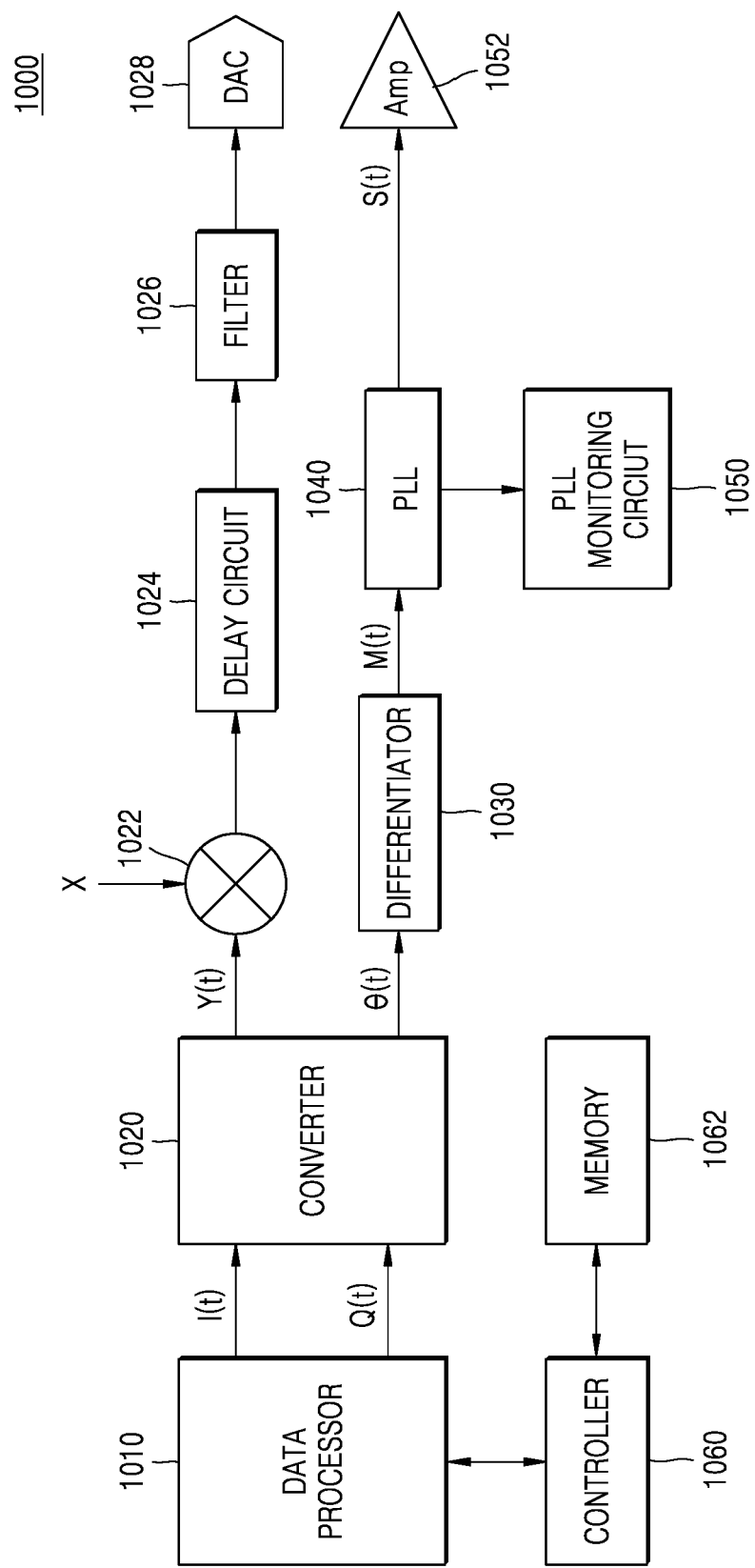
FIG. 16 is a block diagram illustrating an electronic device including a monitoring circuit, according to an example embodiment.

FIG. 16 is a block diagram illustrating an electronic device including a monitoring circuit, according to an example embodiment.

An electronic device 1000 may be implemented as a communication device to perform communication with another device. For example, the electronic device 1000 may be used for a wireless communication device, a cellular phone, a personal portable information terminal (PDA), a handheld device, a wireless modem, a wireless telephone, a radio station, a Bluetooth device, a healthcare device, a wearable device, and the like.

The electronic device 1000 may also be used for various types of wireless communication systems such as a code division multiple access (CDMA) system, a time division multiple access (TDMA) system, a frequency division multiple access (FDMA) system, an orthogonal FDMA (OFDMA) system, a wireless local area network (WLAN), WiFi, and Bluetooth. The electronic device 1000 may also support CDMA wireless technology such as CDMA 2000 and wideband-CDMA (W-CDMA). In addition, the electronic device 1000 may support TDMA wireless technology such as a global system for mobile communication (GSM).

Within the electronic device 1000, a data processor 1010 may acquire a symbol by processing data. Here, the processing of the data may be based on encoding or modulating the data. The data processor 1010 may also acquire a complex-valued sample by performing another type of processing (for example, diffusion, scrambling, or the like) on the symbol according to radio technology used for communication. The data processor 1010 may provide an in-phase data signal I(t) including a real part of each complex-valued sample and a quadrature data signal Q(t) including an imaginary part of each complex-valued sample. A converter 1020 may receive the in-phase data signal I(t) and the quadrature data signal Q(t), convert each complex-valued sample into polar coordinates from Cartesian coordinates, and may provide an envelope signal Y(t) and a phase signal θ(t).

In an envelope path, a multiplier 1022 may obtain a wanted output power level by multiplying the envelope signal Y(t) by a gain X. A delay circuit 1024 may provide a programmable delay to align the envelope signal Y(t) and the phase signal θ(t) in a time domain. A filter 1026 may filter the delayed envelope signal with an appropriate filter response. A digital-to-analog converter (DAC) 1028 may convert the filtered envelope signal to an analog signal, and may also provide an output envelope signal. A gain of a power amplifier (PA) may be adjusted by the output envelope signal to achieve amplitude modulation.

In a phase path, a differentiator 1030 may differentiate the phase signal θ(t), and may provide a modulation signal M(t) including frequency components of the in-phase data signal I(t) and the quadrature data signal Q(t).

A phase locked loop (PLL) 1040 may receive the modulation signal M(t), and may generate a signal S(t) having a phase and a frequency modulated based on the modulation signal M(t). According to an example embodiment, the phase locked loop 1040 may provide signals to a PLL monitoring circuit 1050, and the PLL monitoring circuit 1050 may monitor operations of a plurality of components included in the phase locked loop 1040, based on signals provided in the methods described above with reference to FIGS. 1 to 15.

An amplifier (Amp) 1052 may amplify the signal S(t) having the modulated phase. The power amplifier may also amplify an output of the amplifier 1052 based on the output envelope signal, and may output an RF output signal including both modulated phase and amplitude.

A controller 1060 may control operations of the data processor 1010 and the other components within the electronic device 100. A memory 1062 may store data and command code for the controller 1060 and/or the other components.

In some embodiments, the phase locked loop 1040 may be implemented in software logic, and the memory 1062 may store command code related to a modulation operation of the phase locked loop 1040. The controller 1060 and the data processor 1010 may execute the command code stored in the memory 1062 to perform the modulation operation of the phase locked loop 1040.

In addition, various types of components within the electronic device 100 may be digitally implemented. For example, in the data processor 1010, the filter 1026, the differentiator 1030, and the controller 1060 may be implemented as one or more digital signal processors (DSPs), reduced instruction set computers (RISC), and central processing units, or the like. The digital blocks may be implemented on one or more application-specific integrated circuits (ASICs) and/or other types of integrated circuits (ICs). In some embodiments, the remaining components within the electronic device 1000 may be implemented as analog circuits.

Figure 17:
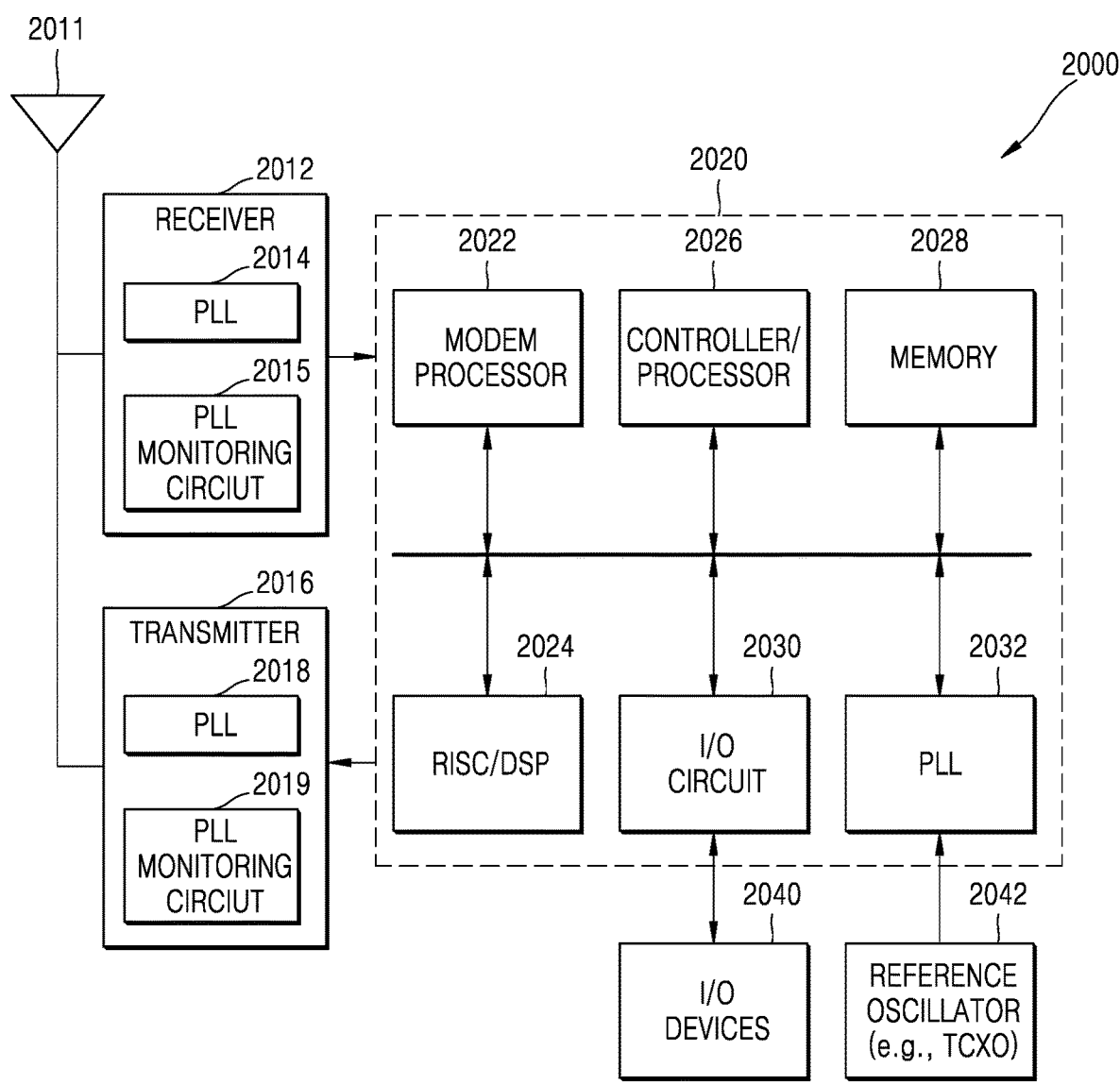
FIG. 17 is a block diagram illustrating a communication device including a monitoring circuit, according to an example embodiment.

FIG. 17 is a block diagram illustrating a communication device including a monitoring circuit, according to an example embodiment.

Referring to FIG. 17, a communication device 2000 may include a receiver 2012, a transmitter 2016, a communication interface 2020, an antenna 2011, an input/output device 2040, and a reference oscillator 2042. The receiver 2012 may include a phase locked loop 2014 configured to generate an output signal, and a PLL monitoring circuit 2015. The receiver 2012 may convert, to a digital signal, an analog signal received from the outside via the antenna 2011 by using the output signal of the phase locked loop 2014, and then may provide the digital signal to the communication interface 2020. Here, the PLL monitoring circuit 2015 may monitor whether or not the phase locked loop 2014 operates normally, based on an input signal and the output signal of the phase locked loop 2014, and internal signals generated inside the phase locked loop 2014.

The transmitter 2016 may include a phase locked loop 2018 configured to generate an output signal, and a PLL monitoring circuit 2019. The transmitter 2016 may convert, to an analog signal, a digital signal received from the communication interface 2020 by using the output signal of the phase locked loop 2018, and then may output the analog signal to the outside via the antenna 2011. Here, the PLL monitoring circuit 2019 may monitor whether or not the phase locked loop 2018 operates normally, based on an input signal and the output signal of the phase locked loop 2018, and internal signals generated inside the phase locked loop 2018.

The communication interface 2020 may include a modem processor 2022, a RISC/DSP 2024, a controller/processor 2026, a memory 2028, an input/output (I/O) circuit 2030, and a phase locked loop (PLL) 2032.

The modem processor 2022 may perform processing operations, such as encoding, modulation, demodulation, and decoding, for data transmission and data reception. The RISC/DSP 2024 may perform a normal or particularized processing operation in the communication device 2000. The controller/processor 2026 may control blocks within the communication interface 2020. The memory 2028 may store data and various types of command codes. The input/output circuit 2030 may communicate with the external input/output device 2040. The phase locked loop (PLL) 2032 may perform a modulation operation by using a frequency signal received from the reference oscillator 2042. The reference oscillator 2042 may be implemented as a crystal oscillator (XO), a voltage controlled crystal oscillator (VCXO), a temperature compensated crystal oscillator (TCXO), or the like. The communication interface 2020 may perform a processing operation needed for communication, by using an output signal generated by the phase locked loop 2032.

While example embodiments have been particularly shown and described, it will be understood that various changes in form and details may be made therein without departing from the spirit and scope of the following claims.

What is claimed is:

1. A monitoring circuit comprising:
 a phase locked loop configured to generate an output signal by dividing an input signal based on a plurality of dividers;
 a plurality of dividing monitoring circuits, each dividing monitoring circuit being associated with a respective divider of the plurality of dividers and configured to receive a dividing input signal and a dividing output signal corresponding to the respective divider and to output a dividing error signal based on a dividing ratio range and a dividing ratio of the dividing output signal to the dividing input signal corresponding to the respective divider; and
 a jitter monitoring circuit configured to output a jitter error signal based on jitter of a signal generated in the phase locked loop and a jitter error range set in a calibration mode.

2. The monitoring circuit of claim 1, wherein the phase locked loop comprises:
 a phase frequency detector configured to output a detection signal corresponding to a phase difference between a reference signal and a feedback signal;
 a loop filter configured to output a control voltage;
 a charge pump configured to charge or discharge the loop filter based on the detection signal; and an oscillating signal generator configured to generate an oscillating signal based on the control voltage.

3. The monitoring circuit of claim 2, wherein the plurality of dividers comprise:
a first divider configured to provide the phase frequency detector with the reference signal obtained by dividing the input signal by a first value;
a second divider configured to provide the phase frequency detector with the feedback signal obtained by dividing the oscillating signal by a second value; and
a third divider configured to generate the output signal by dividing the oscillating signal by a third value.

4. The monitoring circuit of claim 2, further comprising:
a control voltage monitoring circuit configured to output a control voltage error signal based on a voltage level of the control voltage and a voltage error range;
a lock detecting circuit configured to output a phase align error signal based on a phase error range, a phase of the feedback signal generated from the oscillating signal and a phase of the reference signal; and
a phase locked loop dividing ratio monitoring circuit configured to output an overall dividing error signal based on the dividing ratio range and a dividing ratio of the output signal to the input signal.

5. The monitoring circuit of claim 1, wherein each dividing monitoring circuit of the plurality of dividing monitoring circuits comprises:
a clock generating circuit configured to generate a clock signal based on a dividing ratio and a dividing output signal corresponding to each dividing monitoring circuit of the plurality of dividing monitoring circuits;
a counter configured to count a number of edges of the dividing input signal when the clock signal is at a first logic level; and
a dividing ratio comparing circuit configured to determine whether the dividing ratio of the dividing output signal to the dividing input signal is out of the dividing ratio range by comparing the counted number of edges with a reference dividing number.

6. The monitoring circuit of claim 5, wherein each dividing monitoring circuit of the plurality of dividing monitoring circuits further comprises a filter circuit configured to at least temporarily store counted numbers of edges respectively counted in a plurality of sections in which the clock signal is at the first logic level, and provide the dividing ratio comparing circuit with an average counting number obtained by averaging the stored counted numbers.

7. The monitoring circuit of claim 5, wherein each dividing monitoring circuit of the plurality of dividing monitoring circuits further comprises a stuck checking circuit configured to output a stuck high signal or a stuck low signal based on the counted number of edges and a stuck level.

8. The monitoring circuit of claim 1, wherein the jitter monitoring circuit comprises:
an upper limit jitter monitoring circuit configured to set an upper limit level of the jitter error range, and monitor whether the jitter of the signal generated in the phase locked loop is greater than the upper limit level; and
a lower limit jitter monitoring circuit configured to set a lower limit level of the jitter error range, and monitor whether the jitter of the signal generated in the phase locked loop is less than the lower limit level.

9. The monitoring circuit of claim 8, wherein each of the upper limit jitter monitoring circuit and the lower limit jitter monitoring circuit comprises:
a multiplexer configured to output a calibration signal in the calibration mode, and output the signal generated in the phase locked loop, in a jitter monitoring mode;
a pulse generating circuit configured to output a lead pulse signal and a lag pulse signal delayed by one period of an output signal of the multiplexer from the lead pulse signal;
a delay circuit configured to receive the lead pulse signal, and delay the lead pulse signal by a delay period to output a delay pulse signal;
a phase difference detecting circuit configured to compare a phase of the delay pulse signal with a phase of the lag pulse signal to obtain a comparison result; and
a delay period adjusting circuit configured to receive the comparison result to adjust the delay period in the calibration mode.

10. The monitoring circuit of claim 9, wherein the phase difference detecting circuit of the upper limit jitter monitoring circuit is further configured to output the comparison result having a logic high level based on the phase of the delay pulse signal being ahead of the phase of the lag pulse signal; and
the phase difference detecting circuit included in the lower limit jitter monitoring circuit outputs the comparison result having the logic high level based on the phase of the lag pulse signal being ahead of the phase of the delay pulse signal.

11. The monitoring circuit of claim 10, wherein the jitter monitoring circuit outputs the jitter error signal based on at least one of the upper limit jitter monitoring circuit and the lower limit jitter monitoring circuit outputting the comparison result having the logic high level in the jitter monitoring mode.

12. The monitoring circuit of claim 10, wherein the delay period adjusting circuit comprises an adder configured to increment a counting number by one based on receiving the comparison result having the logic high level, from the phase difference detecting circuit in the calibration mode, and provide the incremented counting number to the delay circuit.

13. A method of monitoring a phase locked loop comprising a plurality of dividers, the method comprising:
receiving dividing input signals and dividing output signals respectively corresponding to the plurality of dividers;
outputting dividing error signals corresponding to respective divider of the plurality of dividers, based on a dividing ratio range and a dividing ratio of the dividing output signal to the dividing input signal corresponding to the respective divider; and
outputting a jitter error signal based on jitter of a signal generated in the phase locked loop and a jitter error range set in a calibration mode.

14. The method of claim 13, wherein the outputting the dividing error signals comprises:
generating a clock signal based on the dividing ratio and the dividing output signal corresponding to each divider of the plurality of dividers;
counting a number of edges of the dividing input signal when the clock signal is at a first logic level;
comparing the counted number of edges with an upper limit dividing number and a lower limit dividing number; and
outputting a dividing error signal based on the counted number of edges being greater than the upper limit dividing number or being less than the lower limit dividing number.

15. The method of claim 13, wherein the outputting the jitter error signal comprises:
  setting an upper limit level and a lower limit level of the jitter error range; and
  outputting the jitter error signal based on the jitter of the signal generated in the phase locked loop, the upper limit level, and the lower limit level.

16. The method of claim 15, wherein the setting the upper limit level and the lower limit level comprises:
  generating a lead pulse signal and a lag pulse signal delayed by one period of a calibration signal from the lead pulse signal;
  generating a delay pulse signal by delaying the lead pulse signal by a delay period; and
  outputting, as a comparison result, a difference between a phase of the delay pulse signal and a phase of the lag pulse signal.

17. A monitoring circuit for monitoring a phase locked loop comprising a plurality of dividers, the monitoring circuit comprising:
  a first dividing monitoring circuit configured to receive an input signal of the phase locked loop and a reference signal divided by an input signal divider, and output an input dividing error signal based on a first dividing ratio range and a first dividing ratio of the reference signal to the input signal;
  a second dividing monitoring circuit configured to receive an oscillating signal of the phase locked loop and a feedback signal divided by an oscillating signal divider, and output an oscillating dividing error signal based on a second dividing ratio range and a second dividing ratio of the feedback signal to the oscillating signal;
  a third dividing monitoring circuit configured to receive the oscillating signal of the phase locked loop and an output signal divided by an output signal divider, and output an output dividing error signal based on a third dividing ratio range and a third dividing ratio of the output signal to the oscillating signal; and
  a jitter monitoring circuit configured to output a jitter error signal based on jitter of the oscillating signal and a jitter error range set in a calibration mode.

18. The monitoring circuit of claim 17, wherein each of the first dividing monitoring circuit, the second dividing monitoring circuit, and the third dividing monitoring circuit comprises:
  a clock generating circuit configured to generate a clock signal based on a dividing ratio corresponding to each of the first dividing monitoring circuit, the second dividing monitoring circuit, and the third dividing monitoring circuit and an output signal of a divider;
  a counter configured to count a number of edges of an input signal of the divider when the clock signal is at a first logic level; and
  a dividing ratio comparing circuit configured to determine whether a dividing ratio of the output signal of the divider to the input signal of the divider is out of a dividing ratio range, by comparing the counted number of edges with a threshold dividing number.

19. The monitoring circuit of claim 17, wherein the jitter monitoring circuit comprises:
  an upper limit jitter monitoring circuit configured to set an upper limit level of the jitter error range, and monitor whether jitter of a signal generated in the phase locked loop is greater than the upper limit level; and
  a lower limit jitter monitoring circuit configured to set a lower limit level of the jitter error range, and monitor whether the jitter of the signal generated in the phase locked loop is less than the lower limit level.

20. The monitoring circuit of claim 19, wherein each of the upper limit jitter monitoring circuit and the lower limit jitter monitoring circuit comprises:
  a multiplexer configured to output a calibration signal in the calibration mode, and output the signal generated by the phase locked loop in a jitter monitoring mode;
  a pulse generating circuit configured to output a lead pulse signal and a lag pulse signal delayed by one period of an output signal of the multiplexer from the lead pulse signal;
  a delay circuit configured to receive the lead pulse signal, and delay the lead pulse signal by a set delay period to output a delay pulse signal;
  a phase difference detecting circuit configured to compare a phase of the delay pulse signal with a phase of the lag pulse signal; and
  a delay period adjusting circuit configured to receive a comparison result of the phase difference detecting circuit to adjust the set delay period in the calibration mode.

* * * * *